(12) United States Patent
Lee et al.

(10) Patent No.: US 8,060,345 B2
(45) Date of Patent: Nov. 15, 2011

(54) TRANSFORMING AIRPLANE CONFIGURATION REQUIREMENTS INTO INTELLIGENT SPATIAL GEOMETRY

(75) Inventors: David J. Lee, Mukilteo, WA (US); Margaret J. Taboada, Mountlake Terrace, WA (US)

(73) Assignee: The Boeing Company, Chicago, IL (US)

( * ) Notice: Subject to any disclaimer, the term of this patent is extended or adjusted under 35 U.S.C. 154(b) by 803 days.

(21) Appl. No.: 11/802,827

(22) Filed: May 25, 2007

(65) Prior Publication Data

US 2007/0233433 A1 Oct. 4, 2007

Related U.S. Application Data

(63) Continuation-in-part of application No. 10/802,921, filed on Mar. 18, 2004, now Pat. No. 7,529,649.

(51) Int. Cl.
| | |
|---|---|
| G06F 17/50 | (2006.01) |
| G06F 19/00 | (2011.01) |
| G06F 3/048 | (2006.01) |
| G06G 7/48 | (2006.01) |
| G06T 15/00 | (2011.01) |
| G06T 17/00 | (2006.01) |
| B64D 13/00 | (2006.01) |

(52) U.S. Cl. ....... 703/1; 703/7; 703/8; 700/98; 700/103; 700/119; 700/120; 715/771; 345/419; 345/420; 345/958; 244/118.6

(58) Field of Classification Search .................. 703/1, 2, 703/7, 8; 700/98, 103, 119–120; 715/771; 345/419, 420, 958; 244/118.6

See application file for complete search history.

(56) References Cited

U.S. PATENT DOCUMENTS

| | | | | |
|---|---|---|---|---|
| 4,829,446 | A * | 5/1989 | Draney ............................ | 716/11 |
| 5,231,749 | A * | 8/1993 | Hutchison ...................... | 264/219 |
| 5,572,634 | A * | 11/1996 | Duluk, Jr. ...................... | 345/419 |
| 5,611,503 | A * | 3/1997 | Brauer ........................ | 244/118.6 |
| 5,669,006 | A * | 9/1997 | Joskowicz et al. ............. | 715/202 |
| 5,701,403 | A * | 12/1997 | Watanabe et al. ............. | 345/419 |
| 5,712,964 | A * | 1/1998 | Kamada et al. ............... | 345/418 |
| 6,113,644 | A * | 9/2000 | Weber et al. ...................... | 703/8 |
| 6,128,018 | A * | 10/2000 | Nakajima ...................... | 345/419 |
| 6,132,108 | A * | 10/2000 | Kashiwamura et al. .......... | 703/2 |
| 6,219,049 | B1 * | 4/2001 | Zuffante et al. ............... | 715/764 |
| 6,393,362 | B1 * | 5/2002 | Burns ............................ | 701/301 |
| 6,441,835 | B1 * | 8/2002 | Pazel ............................ | 715/769 |
| 6,452,604 | B1 * | 9/2002 | Sato ............................ | 345/619 |
| 6,545,676 | B1 * | 4/2003 | Ryan et al. ..................... | 345/423 |
| 6,580,428 | B1 * | 6/2003 | Ryan et al. ..................... | 345/423 |

(Continued)

OTHER PUBLICATIONS

"3D CAD Guide for Electronic Product Designers" Author: Solidworks Inc. , pp. 1-8, 2001-2002.*

*Primary Examiner* — Kamini S Shah
*Assistant Examiner* — Akash Saxena

(57) ABSTRACT

A system and method for knowledge based development of interior models for configurable spaces, including storing a digital definition of the interior section of the passenger vehicle and parameters related to the objects, storing a digital definition of a plurality of three dimensional stay-out spaces associated with one or more of the objects, defining one or more collision rules between a first three dimensional stay-out space and a second three dimensional stay-out space, the rules define whether the first three dimensional stay-out space and the second three dimensional stay-out space may overlap, and designing the interior section to accommodate objects based on the defined collision rules and object parameters.

28 Claims, 23 Drawing Sheets

U.S. PATENT DOCUMENTS

| | | |
|---|---|---|
| 6,611,503 B1 | 8/2003 | Fitzgerald et al. |
| 6,928,618 B2* | 8/2005 | Kohls et al. .................... 715/764 |
| 6,947,875 B2* | 9/2005 | Winkler et al. .................... 703/1 |
| 7,076,323 B2* | 7/2006 | Vanderwiel .................... 700/182 |
| 7,272,254 B2* | 9/2007 | Shankarappa et al. ......... 382/149 |
| 7,295,959 B2* | 11/2007 | Noma et al. ....................... 703/8 |
| 7,479,959 B2* | 1/2009 | Han et al. ....................... 345/420 |
| 7,529,649 B2* | 5/2009 | Lee et al. ........................... 703/1 |
| 7,627,503 B1* | 12/2009 | Champagne et al. ......... 705/26.5 |
| 7,905,451 B2* | 3/2011 | Schotte et al. .............. 244/118.6 |
| 2002/0026296 A1* | 2/2002 | Lohmann et al. ................. 703/1 |
| 2002/0063720 A1* | 5/2002 | Williams ..................... 345/582 |
| 2002/0118229 A1* | 8/2002 | Batori et al. .................. 345/771 |
| 2002/0158497 A1* | 10/2002 | Nivet et al. .................... 297/330 |
| 2002/0161563 A1* | 10/2002 | Elabiad et al. .................... 703/8 |
| 2002/0196258 A1* | 12/2002 | Lake et al. .................... 345/474 |
| 2003/0018454 A1* | 1/2003 | Winkler et al. .................... 703/1 |
| 2003/0103089 A1* | 6/2003 | Ramani et al. ................. 345/848 |
| 2003/0179205 A1* | 9/2003 | Smith et al. .................... 345/474 |
| 2003/0233626 A1* | 12/2003 | Tsuruta et al. .................... 716/10 |
| 2004/0010398 A1* | 1/2004 | Noma et al. ....................... 703/1 |
| 2004/0066067 A1* | 4/2004 | Wagner et al. ............ 297/216.15 |
| 2005/0081161 A1* | 4/2005 | MacInnes et al. ............. 715/765 |
| 2005/0177262 A1* | 8/2005 | Vanderwiel .................... 700/104 |
| 2005/0187742 A1* | 8/2005 | Collodi ............................. 703/2 |
| 2005/0209830 A1* | 9/2005 | Lee et al. ........................... 703/1 |
| 2006/0155402 A1* | 7/2006 | Read ................................ 700/97 |
| 2006/0167630 A1* | 7/2006 | Noma et al. .................... 701/211 |
| 2007/0156540 A1* | 7/2007 | Koren et al. .................... 705/26 |
| 2007/0168923 A1* | 7/2007 | Connor et al. ................. 717/104 |
| 2007/0233433 A1* | 10/2007 | Lee et al. ........................... 703/1 |
| 2007/0233434 A1* | 10/2007 | Lee ................................... 703/1 |
| 2007/0239409 A1* | 10/2007 | Alan ................................. 703/2 |
| 2009/0242700 A1* | 10/2009 | Raymond .................. 244/118.6 |
| 2010/0049475 A1* | 2/2010 | Cazals .............................. 703/1 |
| 2010/0251185 A1* | 9/2010 | Pattenden .................... 715/849 |

* cited by examiner

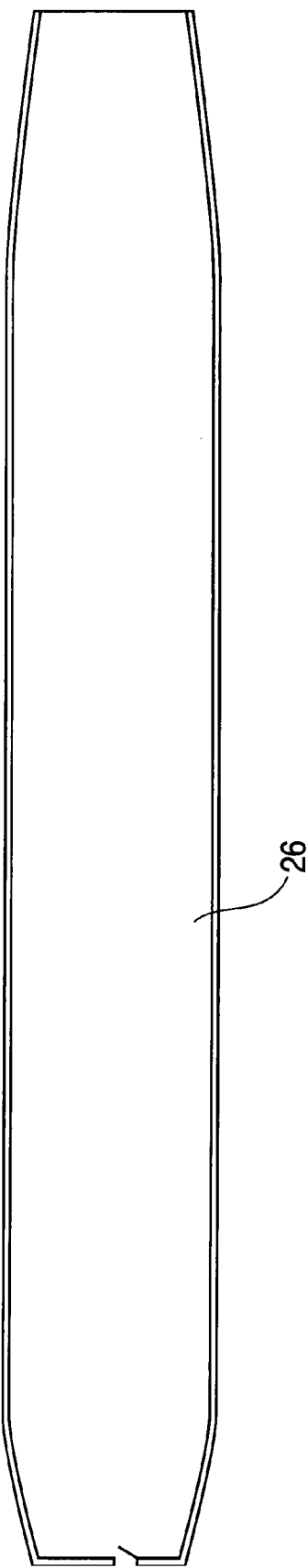

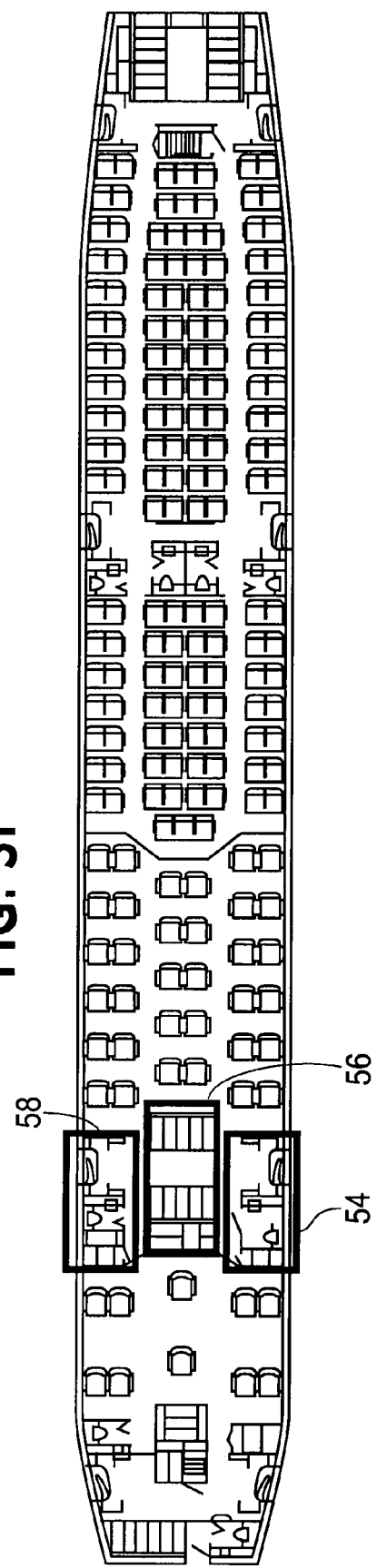

TRANSFORMING AIRPLANE CONFIGURATION REQUIREMENTS INTO INTELLIGENT SPATIAL GEOMETRY

CROSS-REFERENCE TO RELATED APPLICATIONS

This application claims priority to and is a continuation-in-part of U.S. patent application entitled, SYSTEM AND METHOD FOR KNOWLEDGE BASED INTERIOR DEVELOPMENT, filed Mar. 18, 2004, having a Ser. No. 10/802,921, now U.S. Pat. No. 7,529,649, the disclosure of which is hereby incorporated herein in its entirety by reference. This application cross-references a pending application entitled GENERIC HARD/SOFT 3D SPATIAL COLLISION DETECTION METHOD, filed on the same date as this application and incorporates herein in its entirety by reference.

FIELD OF THE INVENTION

The present invention relates generally to a configuration of configurable spaces. More particularly, the present invention relates to transforming the configuration requirements of configurable spaces into intelligent spatial geometry.

BACKGROUND OF THE INVENTION

Interior design for configurable spaces, including passenger vehicles, such as airplanes, buses, subway and train cars, requires adherence to numerous standards and rules. For example, in the United States, the Federal Aviation Administration imposes restrictions on commercial airliners regarding the number of doors, distance between doors and seats or other landmarks, and width of aisles. Additionally, customers or users of the passenger vehicles submit their own requirements regarding distance between seats and other landmarks, in different classes of seating. In addition to specific rules, an overriding concern of manufacturers and purchasers of passenger vehicles is often the optimization of the available interior space to fit the most possible passengers, given the constraints of government, industry, and/or customer rules.

Current interior configuration modeling systems use a manually intensive process. Systems are able to model an interior using exact coordinates of each landmark, without regard for the location of each landmark relative to the other landmarks. This manually intensive process has trouble keeping pace with the rapid change in overall aircraft configuration. For example, if a person charged with the configuration of interiors of passenger vehicles (an "interior configurator") adds a landmark to the configuration, current interior configuration models are unable to shift seats or other landmarks in an efficient way, while also taking into account the constraints of rules imposed by governments, industry standards, and/or customers. Thus, the configurator would have to manually adjust the configuration of the interior to meet rules and standards.

Also, current interior configuration models do not automatically insure optimal seat and landmark locations, allowing for the largest number of seats possible under current constraints. Decisions made using current configuration models are based on limited arrangement data requiring an educated guess as to whether a configuration is optimized. Because the current tools require manual entry of coordinate data for landmarks and seats, the current tool requires constant regular use and a high level of expertise in order to be proficient at configuring and designing interiors. Finally, current tools allow for only manual extraction of internal configuration data, which is of limited utility for downstream processes such as assembly or maintenance.

Accordingly, it would be desirable to use a knowledge-based approach to automate the interior development process. Also, it would be desirable to store configuration data in a manner so that it is accessible to downstream users.

When an airplane is designed for an airline, one of the decisions the airline customer needs to make is what commodities, accessories, spatial walking room, etc., is required for their unique airplane in the passenger compartment where passengers board and travel. This passenger compartment in design terms is called a LOPA, Layout Passenger Accommodations, because it accommodates all the passenger requirements as they sit and travel in the airplane.

The LOPA includes physical commodities, such as galleys, lavatories, closets and stowage bins, etc. Also included in the LOPA are non-physical objects such as walking areas (in cross aisles and passageways), clearance areas for doors, areas where flight attendants sit, and many other areas. There is also space defined where an object may occupy if the airplane were to drop or stop suddenly. Examples of this space is a head strike zone where the passenger's head would travel if projected forward, or seat deflection space, where the seat may move slightly forward. Sometimes spatial areas are required if in front of a passenger seat, for example, where other times it is not required, such as in front of a panel, or partition. Deciding and designing the placement of all these objects, commodities and spatial areas and zones, is a detailed and time consuming task.

A CATIA 3D CAD/CAM (computer aided design/computer aided manufacturing) prototype is used to validate separation/collision in specific cases to validate clearances. Real life prototypes are created out of materials (cardboard, seats . . . ) to imitate the space required between objects. A tape measure is used to measure the distance, or humans are used to validate the clearances. However, the above manual methods are used, but only where validation is required. These manual methods are not very accurate, and are prone to wasted space or even error.

There are disadvantages and limitations of current solutions, in that current processes limit the placement in a 2D (two dimensional) space. Further, related solutions are not able to calculate accurate collisions in all 3D (three dimensional) space directions. Current methods using programmed tools lend to timely and inaccurate measurement calculations between objects. Current method using prototypes are very time dependent, crude and are not always accurate. It is easy to miss separation requirements in detailed object profiles including shape.

Therefore, the current solutions are not able to provide a reasonable solution as shown above.

SUMMARY OF THE INVENTION

The foregoing needs are met, to a great extent, by the present invention, wherein one aspect of the apparatus and technique is provided that in some embodiments provides for transforming configuration requirements into intelligent spatial geometry, without incorporating additional manual or computing processes.

In one embodiment of the present invention, including storing a digital definition of the interior section of the passenger vehicle and parameters related to the objects, storing a digital definition of a plurality of three dimensional stay-out spaces associated with one or more of said objects, defining one or more collision rules between a first three dimensional stay-out space and a second three dimensional stay-out space, the rules define whether said first three dimensional stay-out space and said second three dimensional stay-out space may overlap, and designing the interior section to accommodate objects based on said defined collision rules and object parameters.

In another aspect of the present invention, the method can further include defining at least one collision rule between the three dimensional stay-out spaces and the interior section of the passenger vehicle and parameters related to the objects. In addition, the first and second digital definition can include a plurality of data objects representing different aspects of the interior. The first and second digital definitions can be displayed and manipulated visually, and designing the interior section can be displayed. The stay-out spaces can be defined according to a plurality of predefined constraints. The first digital definition includes physical constraints of the objects. The collision rules are between a plurality of first and second digital definitions. The collision rules include between the plurality of first digital definition of the interior section of the passenger vehicle and parameters related to the objects and the second digital definition of the plurality of three dimensional stay-out spaces associated with one or more of said objects.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIGS. 3A, 3B, 3C, 3D, 3E, 3F and 3G are illustrations of different portions of vehicles as used in an embodiment of the present invention.

DETAILED DESCRIPTION

An embodiment in accordance with the present invention provides a Knowledge Based Interior Development tool, or an eConfig tool, that enhances and automates the process for developing interior configurations. The tool enables configurators to easily and efficiently generate the large number of interior configurations required in the product development, sales, and customer introductions environment. Additionally, the data generated by the application provides the foundation for sharing configuration data among downstream users. A full-time link to a database is established to retrieve the required input parameters and then the configuration geometry and arrangement is generated in the Computer Aided Design system by the Knowledge Based Interior Development tool. Finally, the selected rule-set is saved back to the database for future reference. Specific data, such as seat and commodity locations, may also be stored in a database for future use by downstream users.

The Knowledge Based Interior Development tool enables the users to easily and efficiently access and share geometry and parameter data for the development of interior designs while consistently checking and assuring compliance with certification regulations. The Knowledge Based Interior Development tool establishes a number of new approaches to interior design. The system uses a rule based approach, which allows users to select configuration requirements, or rule sets, from a series of dialog boxes. The system saves the rule set, creates the geometry of the interior, and lays out the interior arrangement, at run time, when the rule sets are chosen and/or created. The system captures knowledge, rules, and parameters in a database, and can be retrieved on demand.

The interior is designed using a zonal approach, where every object in the system has a zone that defines the boundaries within which it can be placed. In a preferred embodiment, there are seven levels of zones from the Layout of Passenger Accommodation (LOPA) level, which represents the entire interior of the vehicle, to the monument level, which is a separate level for each individual monument, which can include galleys, lavatories and closets. Zones are not defined by their location, but by relation to the neighboring zones and features of the vehicle. Each zone shares boundary information with the neighboring zones and becomes the component of the parent level zone. The Knowledge Based Interior Development tool uses a database approach, whereby a full time link is established to a database holding the required parameters. The system can access the database to output the configuration rule set, the static geometry, and location data, which can be accessed and utilized by downstream systems.

Figure 1:
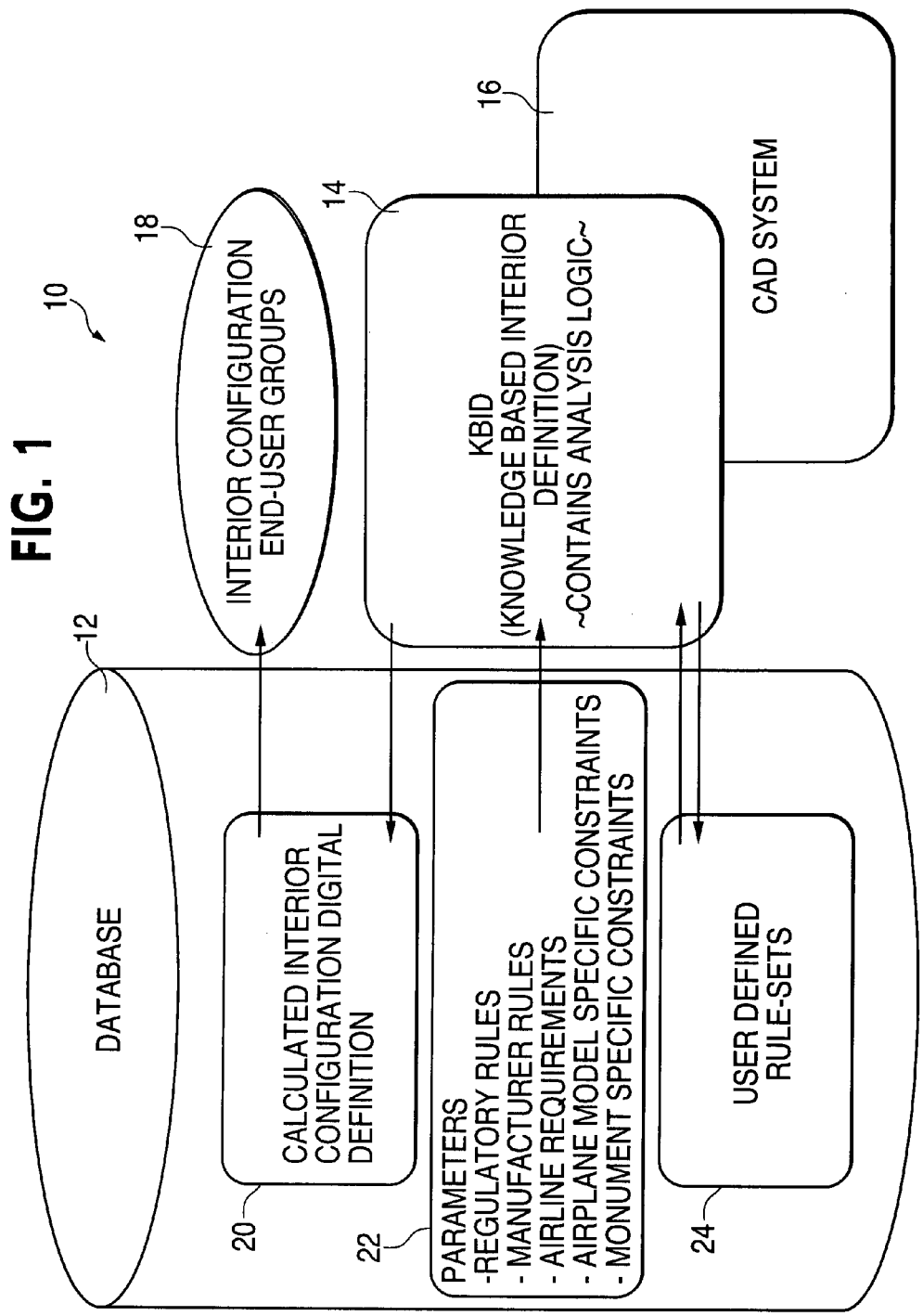
FIG. 1 is a diagram illustrating system architecture according to a preferred embodiment of the invention.

The invention will now be described with reference to the drawing figures, in which like reference numerals refer to like parts throughout. An embodiment of the present inventive system and method is illustrated in FIG. 1, which illustrates the overall architecture of a system 10. The system 10 contains a database 12, Knowledge Based Interior Definition analysis logic 14, a Computer Aided Design (CAD) system 16, and a User Interface 18. The database 12 is stored on a computer-readable storage media, such as a hard disk drive. The analysis logic 14, CAD system 16, and user interface 18 are also stored on storage media. In a preferred embodiment, the analysis logic 14, CAD system 16 and user interface 18 are all stored on the same storage medium as each other, but a different storage medium than the database 12.

The database 12 contains calculated interior configuration digital definitions 20, parameters 22, and user-defined rulesets 24. The parameters 22 include fixed rules that are applicable to all vehicles, or all vehicles of a particular type. These include governmental rules, industry standards, manufacturer standards, customer standards, and/or constraints based on the specific model of vehicle, or based on any specific monument to be placed within that vehicle. The system contains links so that its parts can obtain information from each other. There is a link between the Calculated Interior Configuration Digital Definition 20 and the User Interface 18, so that the user can save the configuration in database format. In a preferred embodiment, the configuration is not saved as a CAD file, in CAD format. This format would store only the coordinate location of each object in the vehicle. Instead, the configuration is saved in the database 12, and contains the rules, parameters, and other settings that are used to create the layout. However, the parameter information in the database 12 can be exported in its native format or in a format usable by other CAD systems, for use in downstream applications such as later redesign, retrofitting, or repair.

There is a link between the analysis logic 14 and the Calculated Interior Configuration Digital Definition 20. The system uses this link so that the analysis logic can save changes to layout plans in the database format discussed above. There is also a link between the parameters 22 and the analysis logic 14. The analysis logic 14 has access to the parameters 22 stored in the database 12, so that the analysis logic 14 can apply the constraints contained in the parameters. The analysis logic 14 applies the parameters 22 to create a layout of an interior, as will be described below. The analysis logic 14 and the user-defined rule-sets 24 have links with each other in both directions. This allows the analysis logic to take rule sets created by the user and save them in the database 12 so that they can be fully accessed during a later process, and also allows the analysis logic to extract user-defined rule sets and apply them to a current layout process. The analysis logic 14 is also layered on top of the CAD system 16. This allows the analysis logic 14 to create a CAD drawing of the layout, so that it can be viewed by the user in visual form, and viewed later by other users using different CAD systems.

Figure 2:
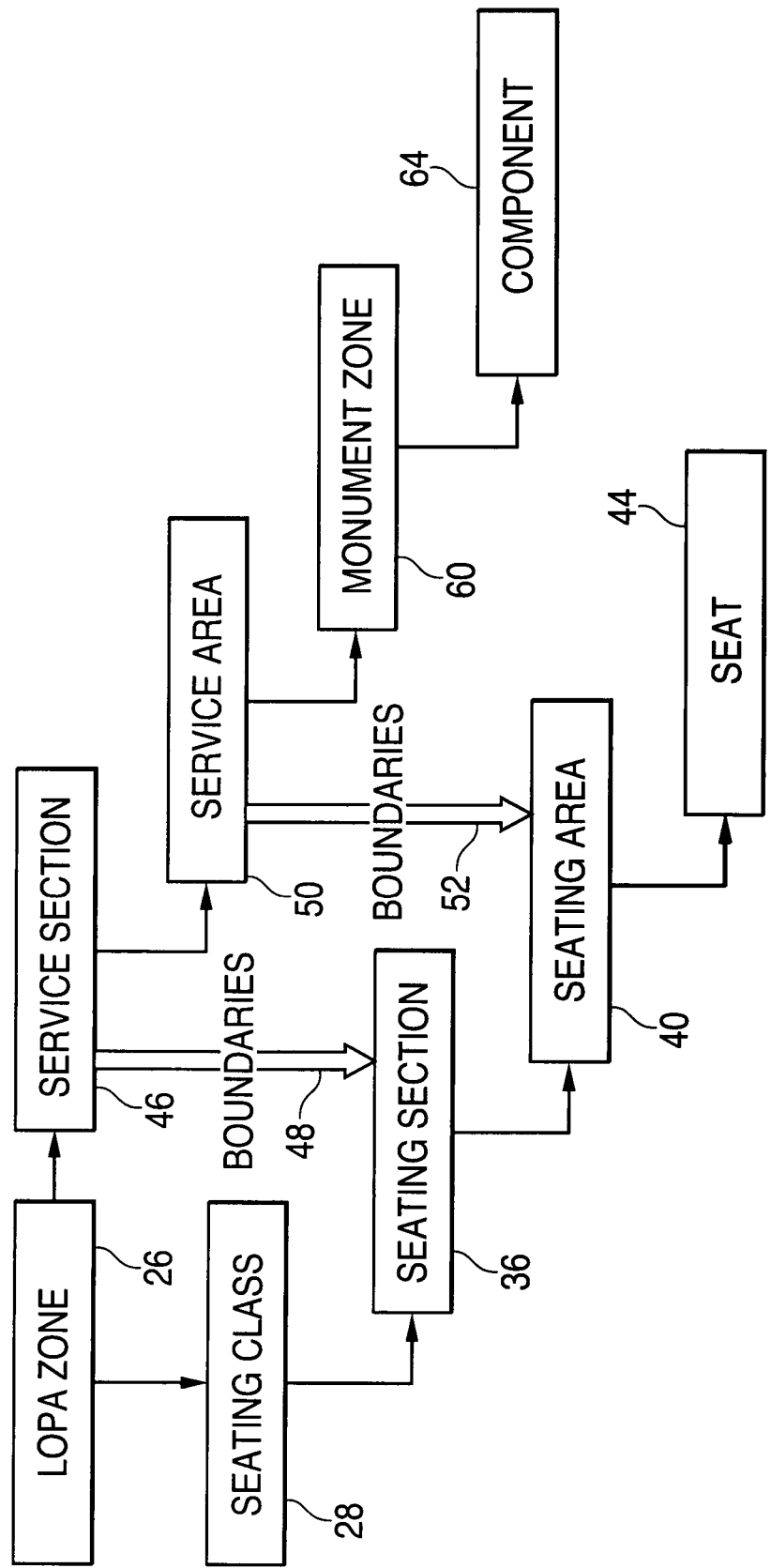
FIG. 2 is a chart illustrating levels of zones according to a preferred embodiment of the present invention.
Figure 3B:
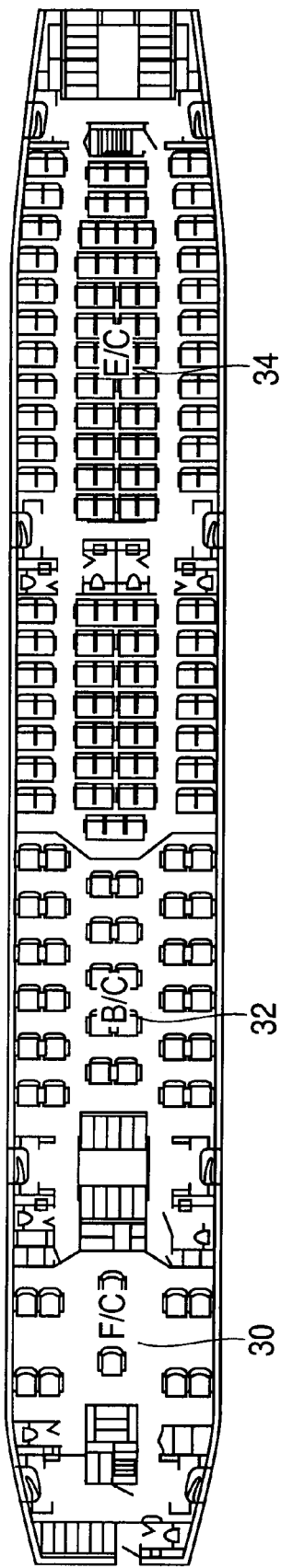

Turning now to FIG. 2, a hierarchical diagram of zones is shown. The system according to a preferred embodiment of the present invention divides the vehicle into a number of zones. The zones are arranged in a hierarchy wherein each zone represents a smaller portion of the vehicle, and there can be one or more smaller zone inside a larger zone. FIGS. 3A-3G show examples of each zone. FIGS. 3A-3G demonstrate the zones in the context of a passenger airplane, but it should be understood by one of ordinary skill in the art that these zones are applicable to any mass transit passenger vehicle. The first zone is the Layout of Passenger Accommodation (LOPA) zone 26, which is shown in FIG. 3A. The LOPA zone is the entire passenger section of the airplane, and is bounded by the forward and aft bulkheads. All of the smaller zones are components of the LOPA zone, as will be shown in the figures below.

The LOPA zone contains multiple zones that can be of two types. One type is the seating class zone 28. As shown in FIG. 3B, the LOPA zone can be divided into one or more seat class zones. Examples of seat class zones are First Class 30, Business Class 32, and Economy Class 34. It should be understood by one of ordinary skill in the art that other seat classes can be used, including premium, economy, and tourist classes. Additionally, it should be understood that some passenger vehicles may have only one seat class zone, which can be commensurate in size with the LOPA zone. Having a passenger vehicle divided into seat class zones allows the configurator or other creators of rules to implement different rules in each seat class zone of the vehicle. Examples of rules that differ between seat class zones would be the width of the seats, the distance from the front to the back of the seat, the distance between the back of one seat to the front of another (e.g. the "legroom"), the amount by which the chairs are permitted to recline, and the width of aisles.

Figure 3C:
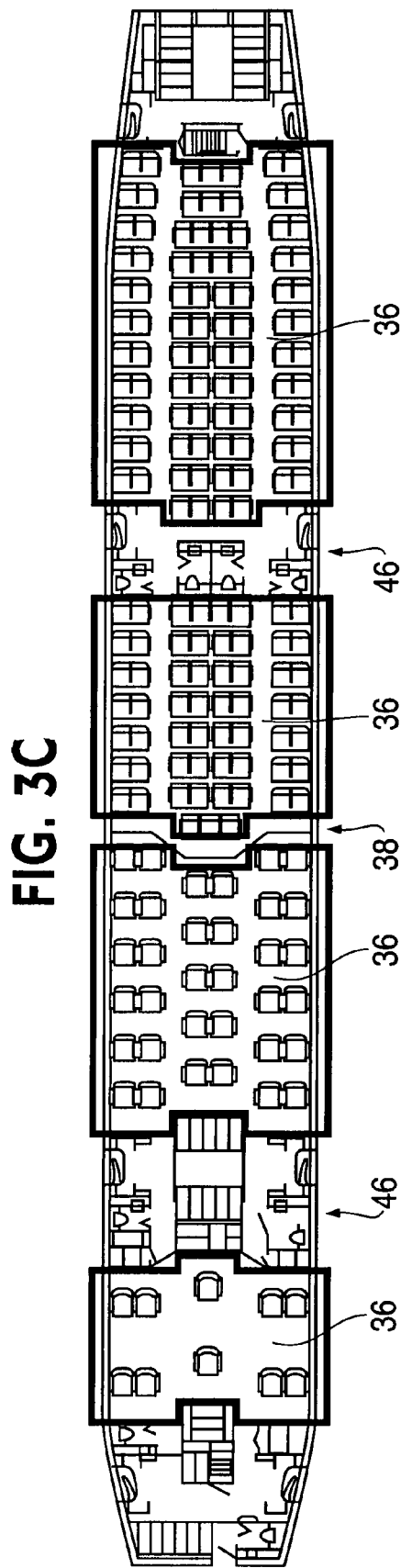

The next zone in the seating branch of the hierarchy is the seating section zone 36, which is depicted in FIG. 3C. The boundaries of these seating section zones are established at each door break 38 within the class zone. By dividing the class zone into seating section zones, configurators can have different rules for different segments of the plane based on the location of the doors 38. Customers or regulatory bodies may have different requirements for seating or other monuments, depending on the side of a given door on which they are located. Creating separate zones for each door-to-door (or door to end-of-plane) segment allows configurators to implement different rules for each segment.

Figure 3D:
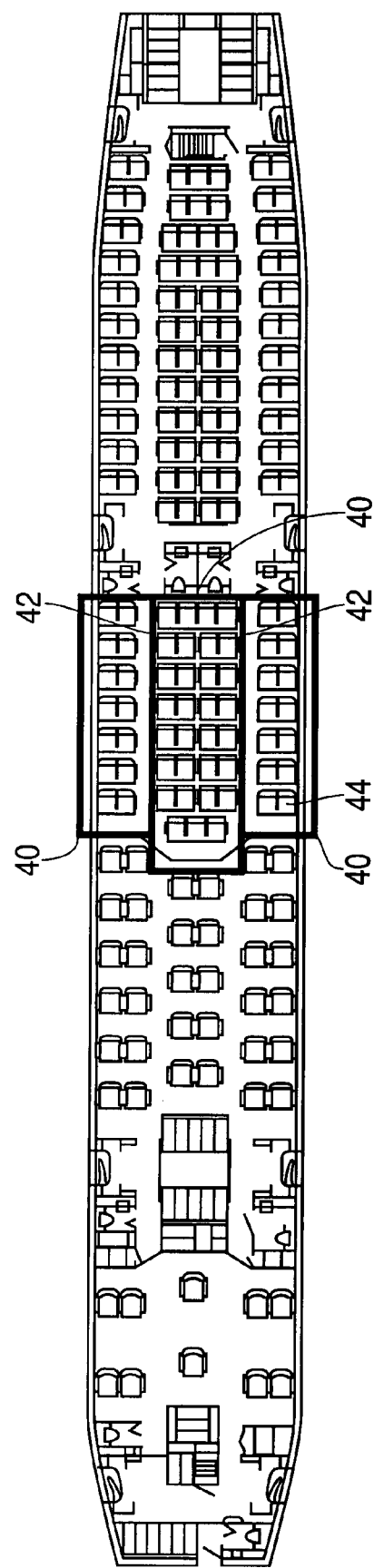

One level lower in the seating branch of the zone hierarchy is seating area zone 40, as illustrated in FIG. 3D. The seating area zones are bounded laterally at each horizontal aisle 42. Having each lateral row of seats, bounded by aisles or the sides of the plane, allows separate rules to be created for each seating area zone. Once a width for a lateral zone has been established, the configurator can experiment with seat configurations, within the rules, to achieve maximum space utilization. The configuration of the seats needed to achieve maximum space utilization may be different on one side or the other or different rules may apply to center rows than apply to side rows. Adding the flexibility to create different configurations based on lateral zone gives configurators the ability to better utilize space. Additionally, the configurator has the option of configuring each individual seat 44.

Figure 3E:
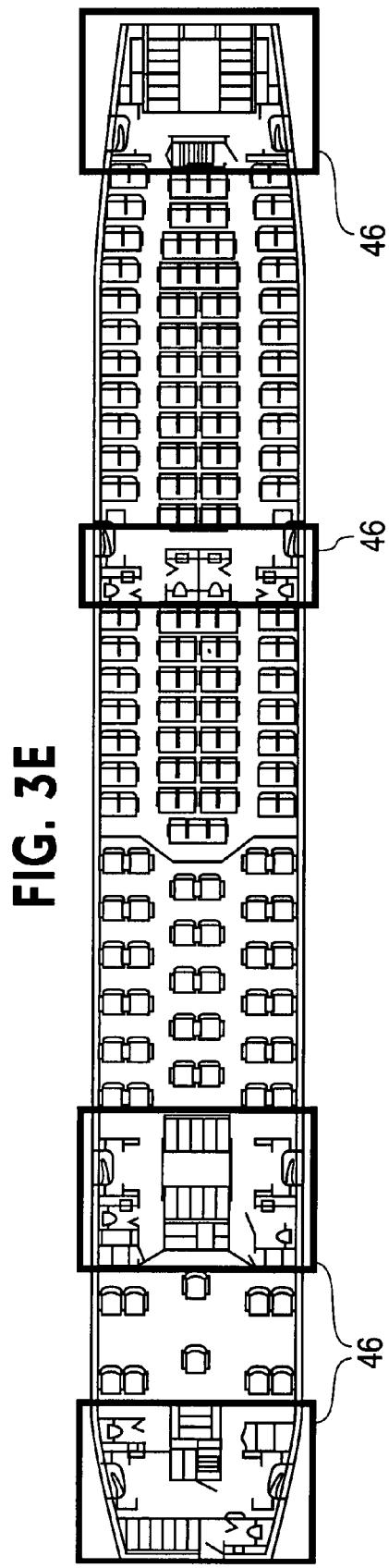

In addition to seating class zones 28, the LOPA zone can also contain one or more service section zones 46, as shown in FIG. 3E. Service section zones are bounded on one or both sides by seating section zones, as depicted by the boundaries 48. Service section zones are those areas of the vehicle where service monuments are stored. Service monuments include galleys (or kitchens), lavatories, and closets. Having a zone for the commodity section as a whole, in addition to smaller zones therein (described below) allows the configurator to adjust the size of the zone as a whole, in relation to the seating sections, without regard to which particular type of commodity is contained within the zone. Also, regulatory bodies and/or customers may have rules regarding commodity zones generally, which can more easily be applied with this more generic zone.

The next zone in the service branch of the zone hierarchy is the service area zone 50, as depicted in FIG. 3F. Much like seating area zones 40, service area zones 50 are separated by aisles. As depicted with the boundaries 52, service area zones 50 are bounded by seating area zones 40. As shown in FIG. 3F, the preferred embodiment uses three service area zones 50 for each service section zone 46: a left service area 54, a center service area 56, and a right service area 58.

Figure 3G:
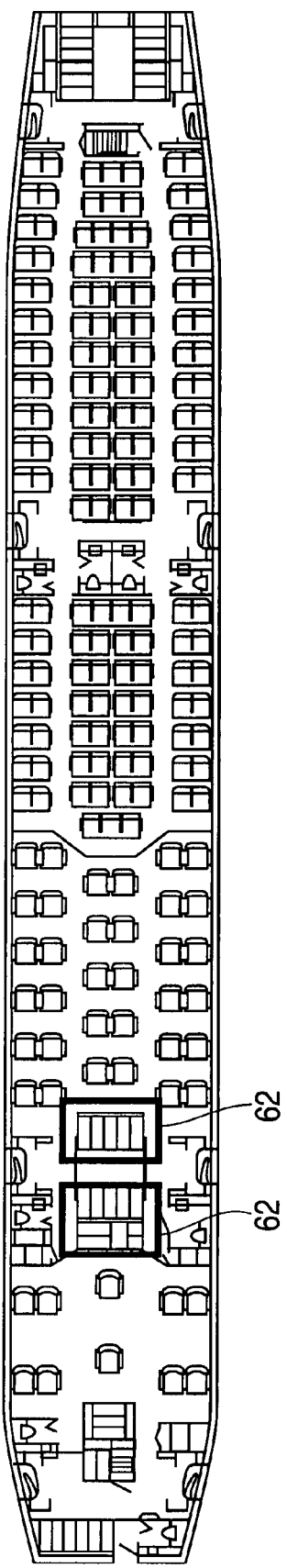

One level lower in the service branch of the zone hierarchy is the monument zone 60, as illustrated in FIG. 3G. The monument zone 60 is defined by the boundaries of each individual monument, such as a lavatory, a galley, or a closet 62. Regulatory agencies or customers could impose rules that a lavatory or galley must have a minimum area, or length or width, or that a galley must, for safety reasons, be surrounded by a certain amount of unused space. These details can be handled with rules that affect the individual monument zones. Additionally, a configurator can add or configure individual components 64 within a particular monument zone.

Because the system uses the zonal approach, a configurator is able to impose rules that affect the entire vehicle, or different portions of the vehicle based on the zone of the portion the configurator would like to change. Some rules have wide-ranging applicability, applying to the entire LOPA zone, including regulations regarding the width of cross-aisles or the number of lavatories. Other decisions will be based on the class of service, including the dimensions of the seats, and the distance separating them. Still other decisions may be based on the cabin zone within a class, including exit-row requirements. Some decisions can apply on a lateral level, including the number of seats in a row. Certain decisions, like the distance between a commodity and a seat, will be governed at the commodity section level. Finally, other decisions may be based on the individual component itself, such as the layout of the inside of a lavatory. The ability to apply these rules at these different levels further automates the design process.

Figure 4:
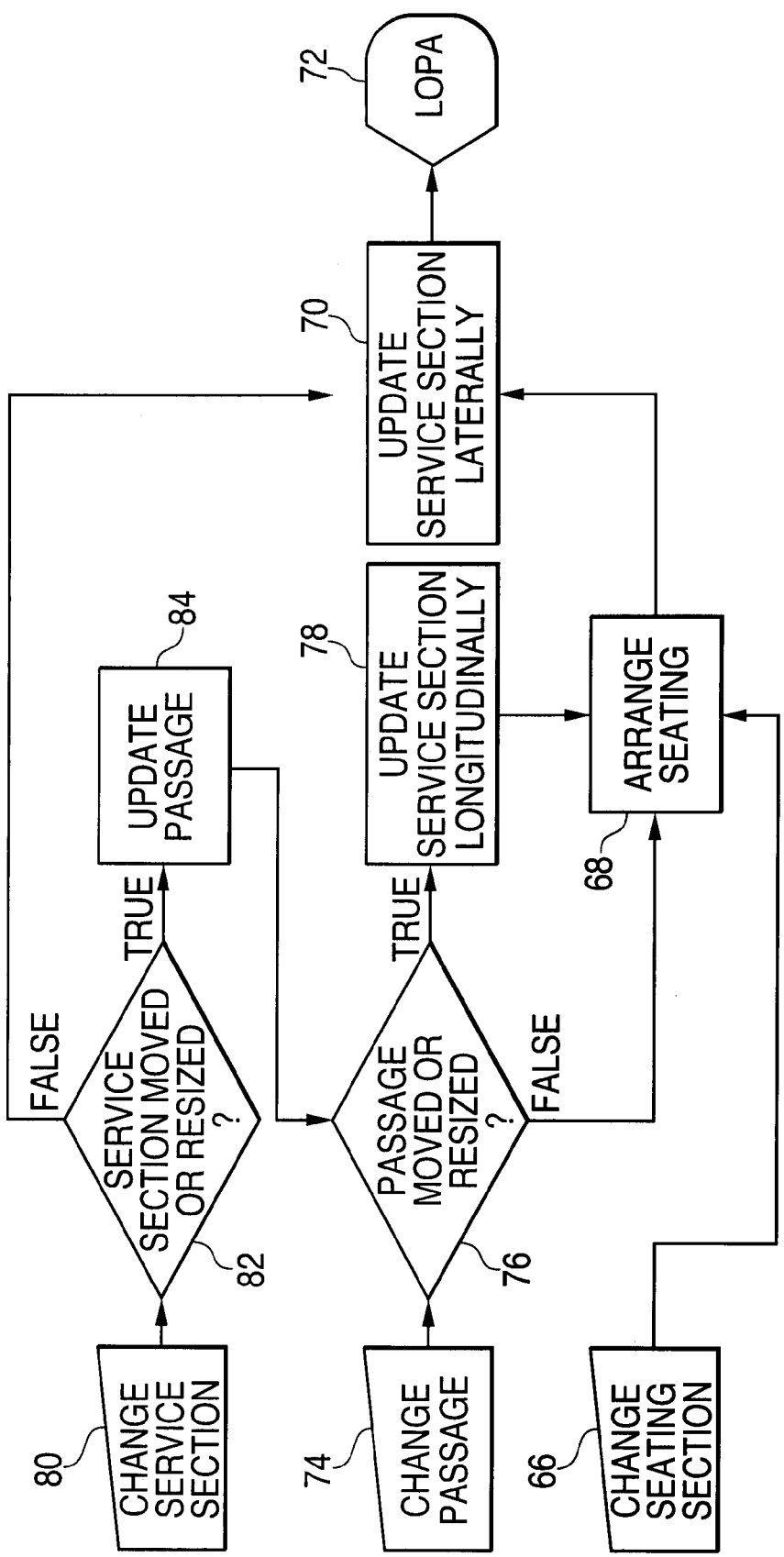
FIG. 4 is a flow chart of the programmatic logic used in an embodiment of the present invention.

Turning now to FIG. 4, the iteration flow logic of a preferred embodiment of the present invention is shown. The configurator, when interacting with the user interface of the system, is given a number of options to change the layout of the vehicle, by changing rules for different zones, or for individual seats or rows of seats. In a preferred embodiment, there are three major categories of change that can be made to a layout by a configurator.

One change a configurator can make to the layout of a vehicle is to change a seating section 66. The configurator can change a seating section by changing any of the properties of seats in that section. For example, the configurator can change the width of the seats in a given section, the pitch of the seats in a given section, or the recline distance of all seats in a given section. It should be noted that these global changes can be made in the seat class model zone, the cabin segment zone, or the lateral zone, allowing the configurator to change the seat dimensions for larger or smaller groups of seats. Additionally, the configurator can change a single row of seats, or a single seat. For instance, in a preferred embodiment, the configurator can ask the system how an extra row of seats can be added to the configuration. The system may inform the user that, if the user reduces the reclining distance of one row by a certain number of inches, an additional row of seats can be added. The configurator's decision to make that individual change triggers the "Change Seating Section" logic 66.

Once the configurator has decided to change a seating section, the software executes the portion of the code that arranges the seating 68. This code is able to rearrange the seating area to take the change into account. The code in this section implements the change specified by the user, and then updates the remainder of the seating section to take that change into account. Because all of the components are interrelated through zones and awareness of boundaries, the update is completed automatically. Following the example above, if the configurator reduces the recline distance of the seats in the last row by one inch, enough space may be freed up behind that row to insert another row of seats. The system knows this because the code is programmed to insert rows of seats behind other rows of seats if another monument (or the aft bulkhead) is not in the way. Thus, by changing the attributes of one row of seats, another row of seats is added automatically.

After the seating has been arranged to reflect the configurator's change, control is passed to the section of code responsible for the function of Updating the Service Section Laterally 70. Here, the software checks if a lavatory or a galley (i.e. a "service area") may be able to be expanded as a result of an update initiated by the user. If a lavatory or galley is preexisting, and no seats can be added, the system may expand the existing service area rather than leave the space adjacent to it unused. After these updates are made, the LOPA is regenerated, with new coordinate data being passed calculated and passed to the CAD system, and the LOPA is redrawn 72.

A configurator can also decide to make a change to a passage 74. A passage is an empty space where people or equipment can travel, including a passageway or a cross-aisle. A cross-aisle is an aisle of lateral orientation, and usually exists near the doors of the vehicle. In the case of passenger airplanes regulated by the United States Federal Aviation Administration, every pair of doors must be accompanied by a cross-aisle of at least 20 inches in width. Manufacturers or customers may have requirements of wider cross-aisles. Also, there may be a requirement that a cross-aisle be wider if it is bordered on either side by a galley or a lavatory. Subject to these constraints, however, a configurator has some leeway in locating passages within the vehicle.

If a passage is changed, the software determines whether the passage has been moved or resized 76. If the passage has not been moved or resized, but has changed in some other way, the software passes control to the seating arrangement code 68. As described above, this code rearranges the seating based on the change made to the configuration—in this case the change to the passage. When the seating has been rearranged, the code passes control to the code used to update service section laterally 70. As described above, this updates a service section based on any seating change, and also based on the passage change. When this update is completed, control is passed to the LOPA reconfiguration code 72, which recalculates all of the coordinate data and redraws the LOPA. The code then returns.

If the passage has been moved or resized, control is passed to the code for updating a service section longitudinally 78. This code is responsible for checking if a service section—a galley or a lavatory—needs to be updated as a result of the moving or resizing of a passage. Because the data representing the service section has links to the data representing the passage, and knows where its boundaries are, the code is able to determine if a service section is affected by a change in a passage. For example, if a configurator decides to expand a cross-aisle beyond the required distance, a galley bordering that cross-aisle may need to be moved forward or backward, depending on the direction of the change in the cross-aisle.

After the service sections bordering or otherwise affected by the moved or resized passage have been updated 78, control is passed to the code for arranging seating 68. As described above, this code rearranges the seating based on the change made to the configuration—in this case the change to the passage. When the seating has been rearranged, the code passes control to the code used to update service section laterally 70. As described above, this updates a service section based on any seating change, and also based on the passage change. When this update is completed, control is passed to the LOPA reconfiguration code 72, which recalculates all of the coordinate data and redraws the LOPA. The code then returns.

In addition to changing seating sections or passages, a configurator can also be presented with the option of changing a service section itself 80. As noted above, a service section is usually either a galley or a lavatory, though a closet or any other monument can also be considered a service section. When the configurator has changed a service section, the code checks if the service station has been moved or resized 82. One way to change a service station without moving or resizing it is to re-arrange the items inside it. For example, the orientation of a commode or a sink within a lavatory can be changed without moving or resizing the lavatory itself. If the service section has not been moved or resized, the system passes control to the code responsible for updating the service section laterally 70. When this update is completed, control is passed to the LOPA reconfiguration code 72, which recalculates all of the coordinate data and redraws the LOPA. The code then returns.

If the service section has been moved or resized, the system passes control to the section of code responsible for updating a passage in response to the change in the service section 84. For example, if a galley is added to the LOPA adjacent to a cross aisle, the cross-aisle must be extended to comply with safety regulations or customer rules requiring wider cross-aisles if they are bordered by a galley. This code updates the data for the passage that needs to be changed as a result of the change to, or addition or deletion of, a service section.

After updating the passage, the system asks if the update to the passage was a move or a resize, or whether it was some other type of update 76. As described above, if the passage has not been moved or resized, the seating may need to be arranged 68, which may result in a need to update a service section laterally 70. When this update is completed, control is passed to the LOPA reconfiguration code 72, which recalculates all of the coordinate data and redraws the LOPA. The code then returns. If the passage has been moved or resized, this triggers a longitudinal update to a service section 78, which may be another service section affected by the original change to a service station. After this has completed, control is passed to the code for arranging seating 68, which passes control to the code for updating a service section laterally 70. When this update is completed, control is passed to the LOPA reconfiguration code 72, which recalculates all of the coordinate data and redraws the LOPA. The code then returns.

Because of the automated nature of the system, updates can be concluded in a much shorter amount of time than was previously possible. This allows for live configuration during a demonstration to a customer, which was impractical with longer configuration times.

Placing LOPA commodities and spatial areas in the airplane (for example 'objects') in 3D (three dimensional) space must follow pre-defined placement and relational rules. As an example, two closets cannot be placed in the same place. Another example is that a seat must have different clearance requirements around it, above and below the arm rest. A seemingly infinite number of permutations are available on how the objects are placed in the airplane. The logic must be intelligent enough to select the best location based on location, rules and collision detection. The basic assumptions include, first, the objects are defined as three dimensional volumes. The second assumption includes that the objects are related to each other in three dimensional space. A third assumption is that the objects are placed in a three dimensional confined space so that they do not collide with one another. A fourth assumption is that the rules must be adhered to when placing objects, including for example but not limited to FAA (federal aviation administration) requirements and other possible rules. A fifth assumption is that the object placement and rules can be applied to any direction in space. A sixth assumption is that the best solution is selected based on provided location (three dimensional space) and best use of space.

Providing the best solution, while following all placement and constraint rules, is the objective, and presents an enormous task in order to provide accurate and consistent results.

A plurality of problems are encountered while designing the LOPA from the enormous task mentioned above. Upon initial object placement, space is not optimized, therefore, a fudge factor is added to the clearance to ensure FAA compliance. The resultant seat count may not be optimized (the most possible). The resultant commodity selection may not be the largest as it could be. The airline may not be getting the best return on their investment by placing fewer seats than could be available if the placement design were more accurate. The three dimensional height measurements cannot be performed with current methods, thereby not checking for collisions/separations above the two dimensional (2D) plane (e.g., head strike to the little pocket on the seat back in front).

The present invention can resolve the entire airplane 3D spatial problems using one computer programming tool, and not just manual methods being used, and not only in specific cases where validation is required. These manual methods and validation required methods are not as accurate as a programming tool of the present invention, and are prone to wasted space or even error.

For example, a CATIA 3D CAD/CAM prototype is used to validate separation/collision in specific cases to validate clearances. Real life prototypes are created out of materials (cardboard, seats . . . ) to imitate the space required between objects. A tape measure is used to measure the distance, or humans are used to validate the clearances.

The present invention includes a computer aided method designed to use specially designed intelligent 3D graphics to place for example, but not limited to, airplane commodities in the airplane interior per regulatory agency/company requirements. The geometry is designed such that it incorporates the engineering requirements for collision and separation rules without the need to use additional manual or computing processes. The result is an accurate placement of commodities providing the best use of space and provides an optimized Return on Investment (ROI) for the airplane customer.

The present invention provides for meeting regulatory agency/company requirements, providing an optimized seat count, providing an optimized commodity arrangement, providing the best return on investment for airplane customers, meeting collision/separation requirement compliance in all 3D spatial directions, reducing the time, resources and cost needed to verify all collision/separation requirements by eliminating manual and other computing processes to verify or determine the results. Further, the software programmed code does not need to be modified when the requirements are added or revised.

The method of the present invention can also be used for any computing application that uses 3D spatial placement. The method of the present invention can be modified to be used in the 2D space as well.

The software code can be used for a variety of applications, and is not dependent on the images provided.

The design method that is described herein does not necessarily function on its own, but rather the technique of the present invention may work within a computing tool. Its purpose is to provide a new and accurate way to design objects, which will be used in a 3D space. The structure of this design is described in the following description.

The present invention incorporates additional graphics around a given object. These additional graphics define the 'stay-out' clearance areas or reference point/plane. They are created as part of the graphic, but each 'stay-out' clearance area or reference point/plane has its own 'intelligent' data attached to it. For example, given a lavatory, there is space in front of the door that the door uses to open and close. The lavatory also has space around it, to provide walking space on the lateral sides. These two spaces are defined separately and comply with their own regulatory data requirements.

Figure 5:
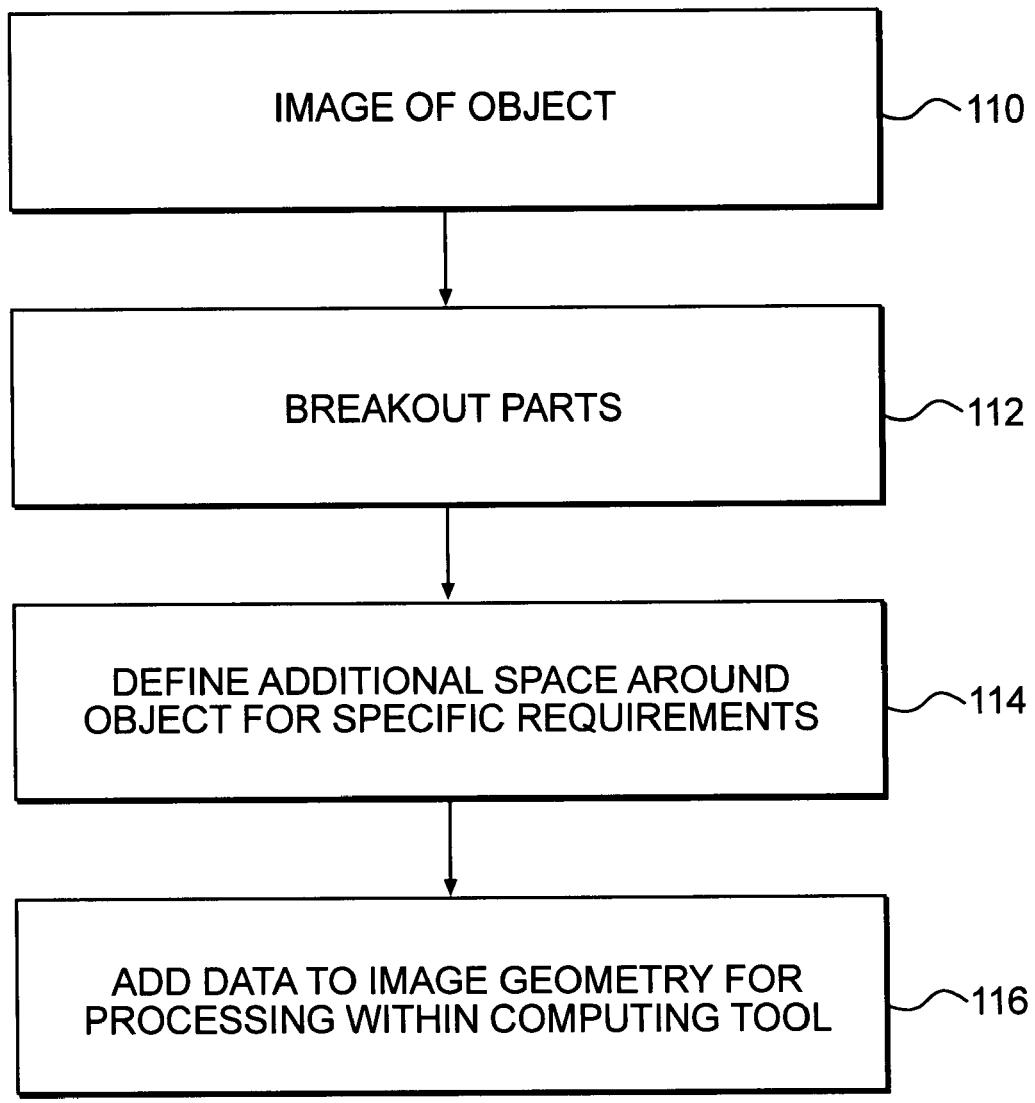
FIG. 5 is a flow chart of the technique used in another embodiment of the present invention.

Referring to FIG. 5, one must start with the image of the object (step 110). Secondly, there is a breakdown of the parts of the object, which require specific collision/separation rules as seen by the examples below (step 112).

Thirdly, one defines additional space around the object part for the specific requirement (e.g. 25" offset around the object for clearance, uniquely defined spatial object to show Head Strike clearance) as seen from the examples below (step 114).

Fourthly, there is an addition of data to the image geometry for processing within the computing tool (e.g., type of clearance, name), (step 116).

The following examples clarify steps 112 and 114 from above. Special intelligent geometry is created that are used in placing commodities in the airplane following rules. These rules may define clearance or collision requirements in the airplane.

Figure 6:
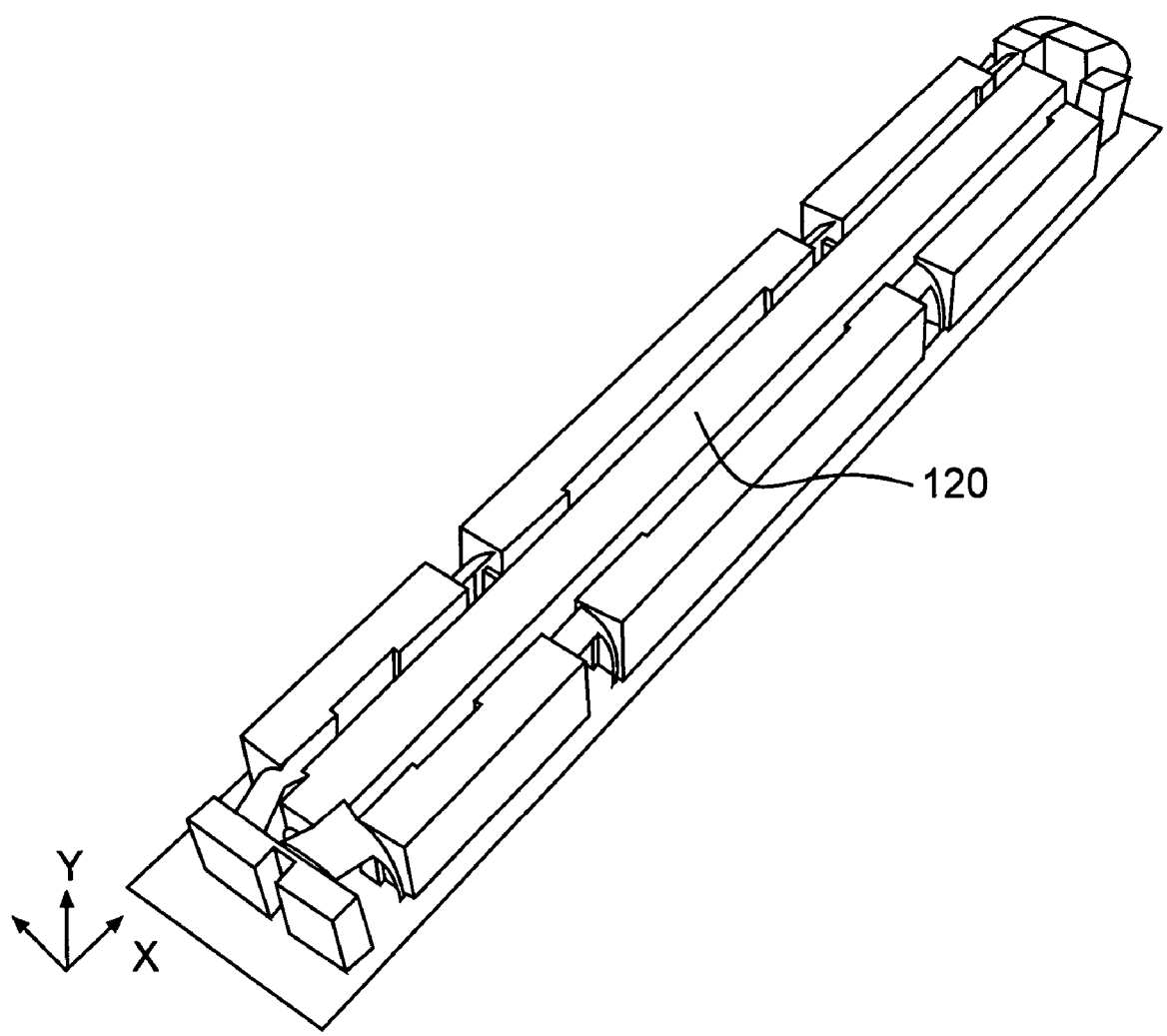
FIG. 6 illustrates the passage way and cross aisle geometries.

Referring to FIG. 6, the installation zone 120 is a non-physical spatial area that defines where commodities may be placed in the airplane. Commodities are verified that they are wholly contained within this space.

The passageways and cross aisles are of non-physical spatial areas. They define the exit paths throughout an airplane for example.

For example, there can be included the constraints of providing an unobstructed 36" passageway for type "A" exit and 20" passageway for type "I" exit, plus (2) 12"×20" assist spaces for type "A" and (1) 12"×20" assist space for type "1". The seats in an airplane can recline into an assist space but cannot encroach while in the upright position or recline into the projected opening of the exit.

There must be an unobstructed 20" cross aisle (dual aisle airplanes) leading between each pair of exits (for mid cross aisle 15" of the cross aisle must be within the projected opening of the door).

Seat deflection defines the space required in front of a seat where the seat may be moved forward in the case of a hard stop of the airplane. The FAA AC (Federal Aviation Administration Advisory Circular) 25.562-1 on "Dynamic Evaluation of Seat Restraint Systems and Occupant Protection on Transport Airplanes" allows 3" maximum forward seat deflection 1 with 1.5" maximum encroachment into attendant assist space.

Figure 7:
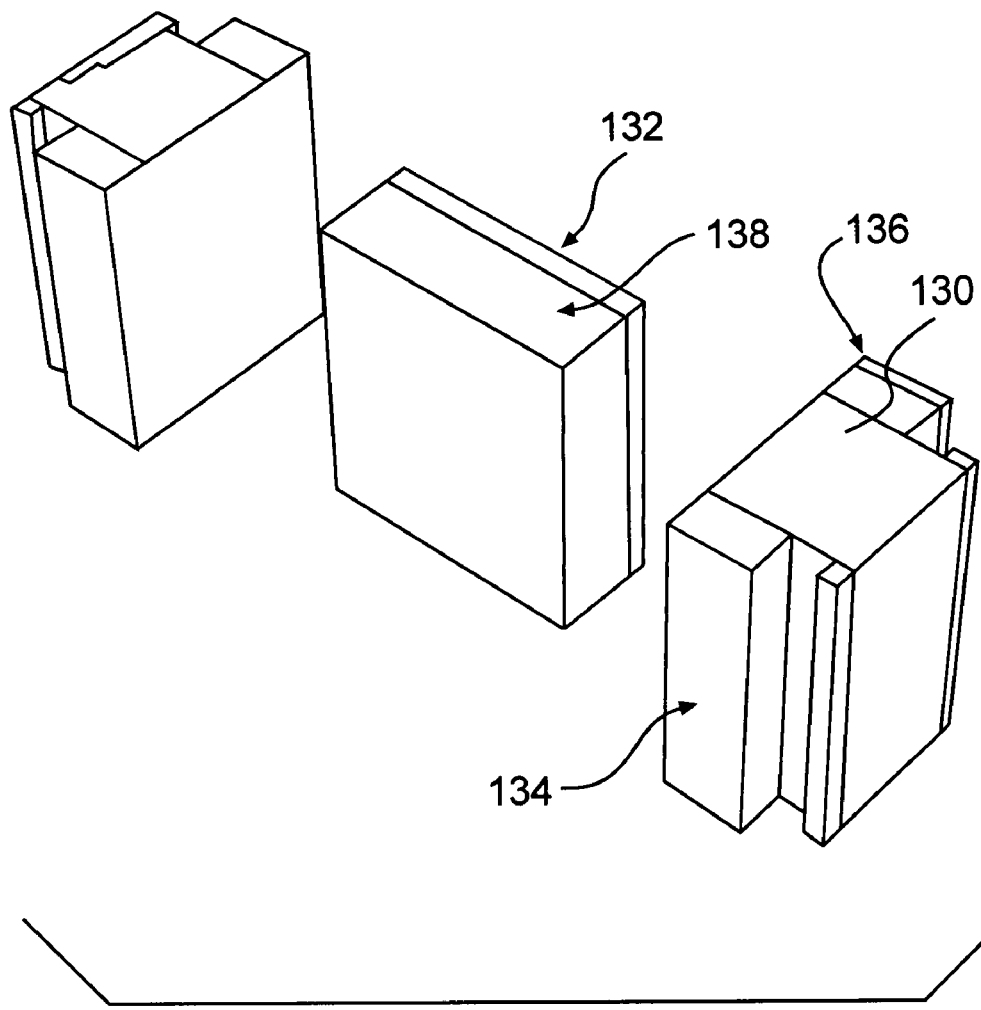
FIGS. 7 through 9 illustrates the seat geometries.

Referring to FIG. 7, the Access aisle 138 defines the exit path for the user or traveler. The egress aisle 130 defines the exit location at the door for the traveler, while the hard surface extra aisle 132 defines the space required if a commodity is placed along the access aisle 138. The assist space 134 defines the area where an attendant will stand when travelers are exiting the airplane. The seat deflection 136 is also shown with respect to the assist space 134, egress aisle 130 and the hard surface extra aisle.

Figure 8:
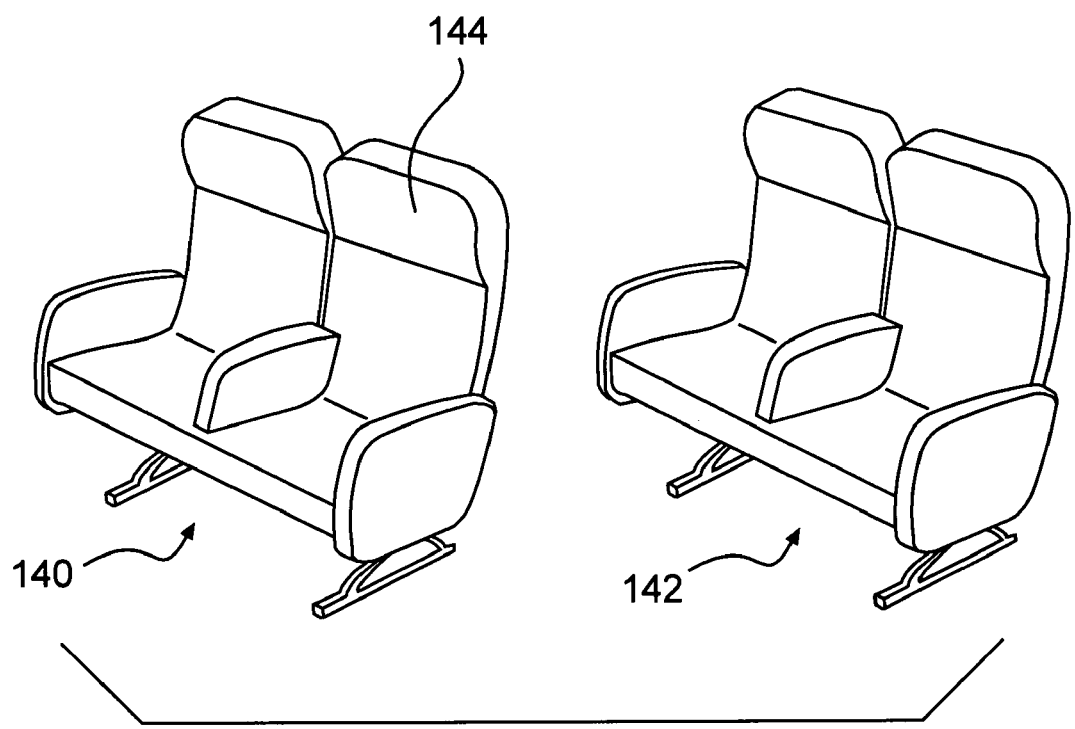
Figure 9:
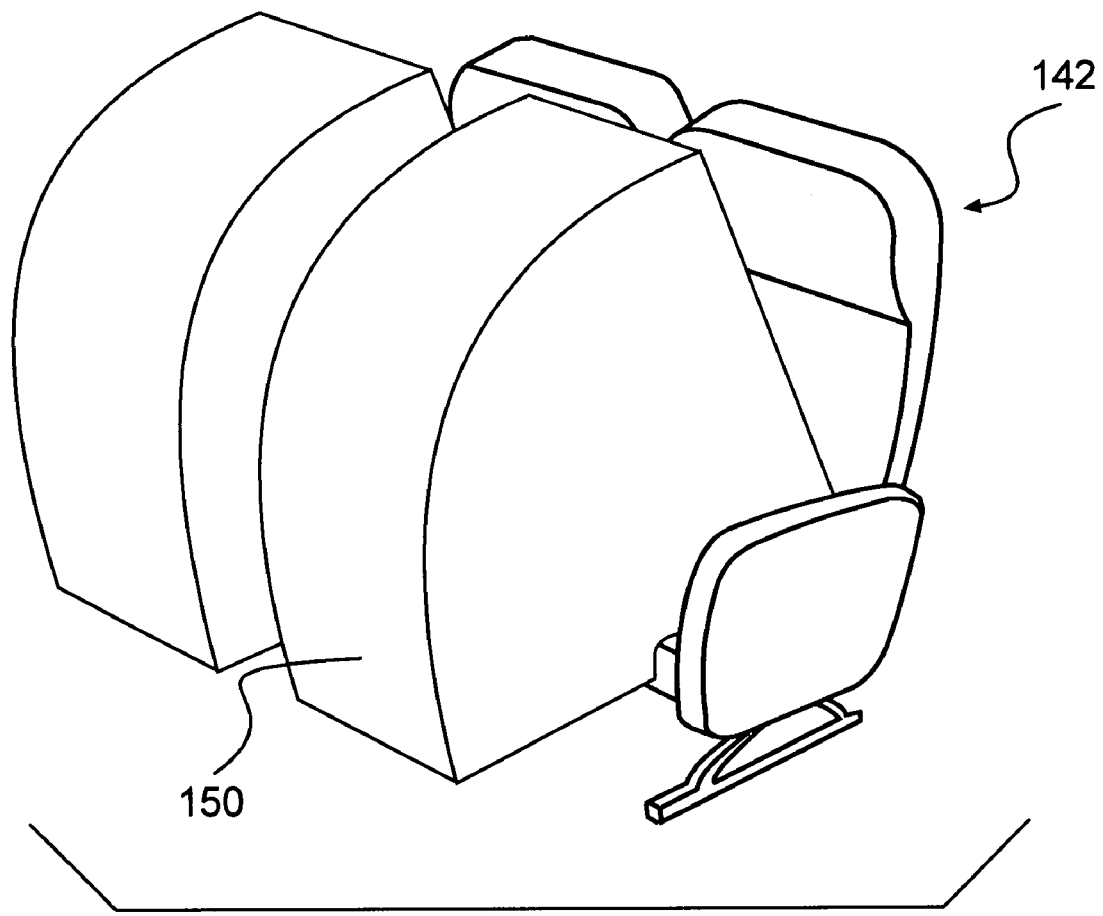

Referring to FIG. 8, a specific example of the use of intelligent spatial geometry includes seats 140 and 142 being defined by not only the physical geometries, but also the non-physical geometries. Therefore, the front seats 140 and the back seats 142 are defined by a collection of both the physical and non-physical geometries. The cushion 144 is an example of a physical geometry that defines the area where the traveler will sit in the seat 140 and 142. The area of the cushion 144 allows collision with the head strike area 150 of the seat behind it as seen in FIG. 9. The head strike area 150 shows how the cushion 144 can collide from the first set of seats 140 to the second set of seats 142 that is located behind the first set of seats 140.

The arm rest 146 is also a physical geometry that defines the area where a traveler would rest or position their arm. The arm rest 146 of seat 140 does not allow collision with the head strike area of the seat 142 behind it.

Referring to FIG. 9, the head strike 150 is the non-physical geometry that defines the area that the traveler's head would occupy when bent forward. For example, the heard strike requirement: FAR (Federal Acquisition Regulation) Amendment 25-64 requires that occupants seated aft of obstacles not impact those obstacles with a force greater than a head impact criteria (HMC) of 1,000. An articulating front row seat bottom with stiffened seat structure and revised seat foam is the current means for compliance. The foreign certification, JAA (joint aviation authorities) or BCAR (British Civil Airworthiness Requirements), although not requiring HIC (head impact criteria), may increase the setback. As seen in FIG. 9, the head strike 150 non-physical geometry can be taken into account.

Figure 10:
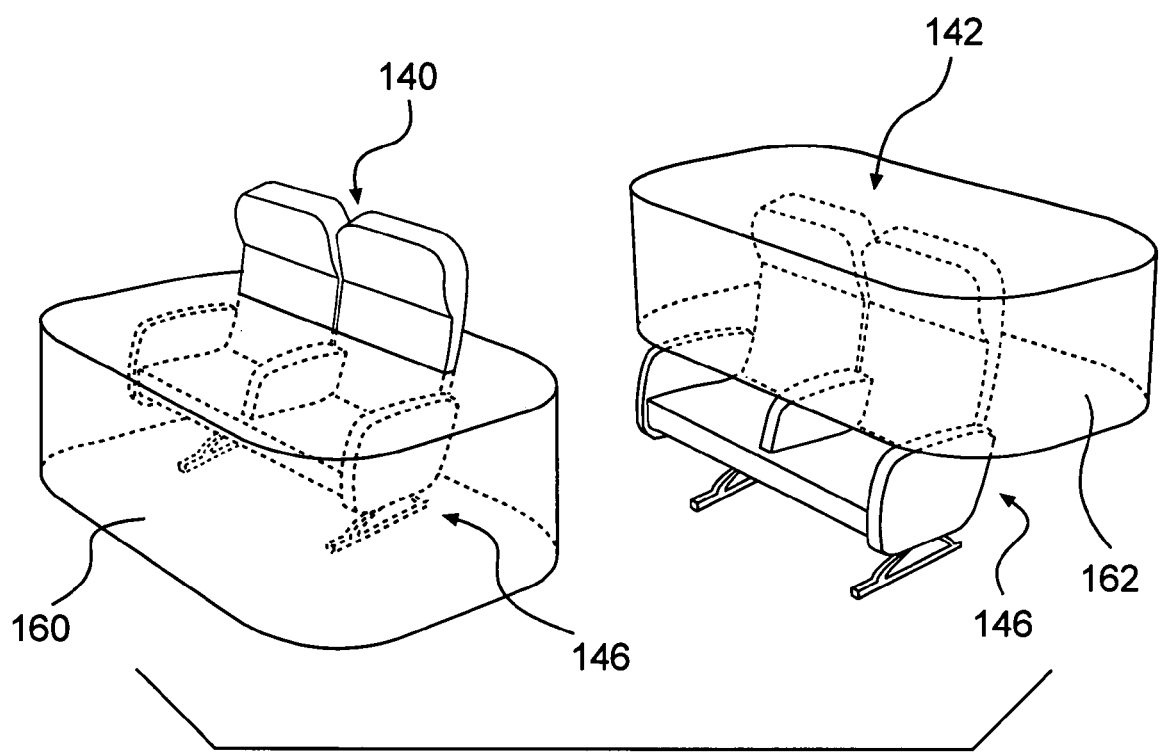
FIG. 10 illustrates the lateral aisle geometries.

Referring to FIG. 10, the lateral aisle, is another example of a non-physical geometry. The lateral aisle 160 and 162 is defined by the area to the side of the commodity where the traveler can walk. The lateral aisle clearance below the arm rest 160 and the lateral aisle clearance above the arm rest 162 are examples of the non-physical geometry.

The seat lateral aisle, therefore can be defined by two separate geometries. One defines a space below, for example 25", or approximately below the arm rest 146 of the seat 140 and 142. This requirement exists to provide clearance for carts as the carts are pushed down the aisle. Without talking into account such a constraint, not only would certain regulations be violated, the travelers could have difficulty moving within the vehicle or other important objects such as the carts. Many other commodity applications can also be used as the lateral aisle is only an example.

The other clearance is defined as above the 25" mark or approximately above the arm rest 146. This requirement of above the arm rest 146 exits to provide an area where the traveler can walk through the vehicle. The aisle width requirement of 25" above the floor is only an example. The JAA, for example, can require 30" between bulkheads. There also must be proved 15" below the armrest, 25" above the floor, and 20" above the armrest. Again, these measurements are examples and the present invention is not limited to such dimensions. The present invention will take into account all these constraints with regard to the non-physical geometry.

Figure 11:
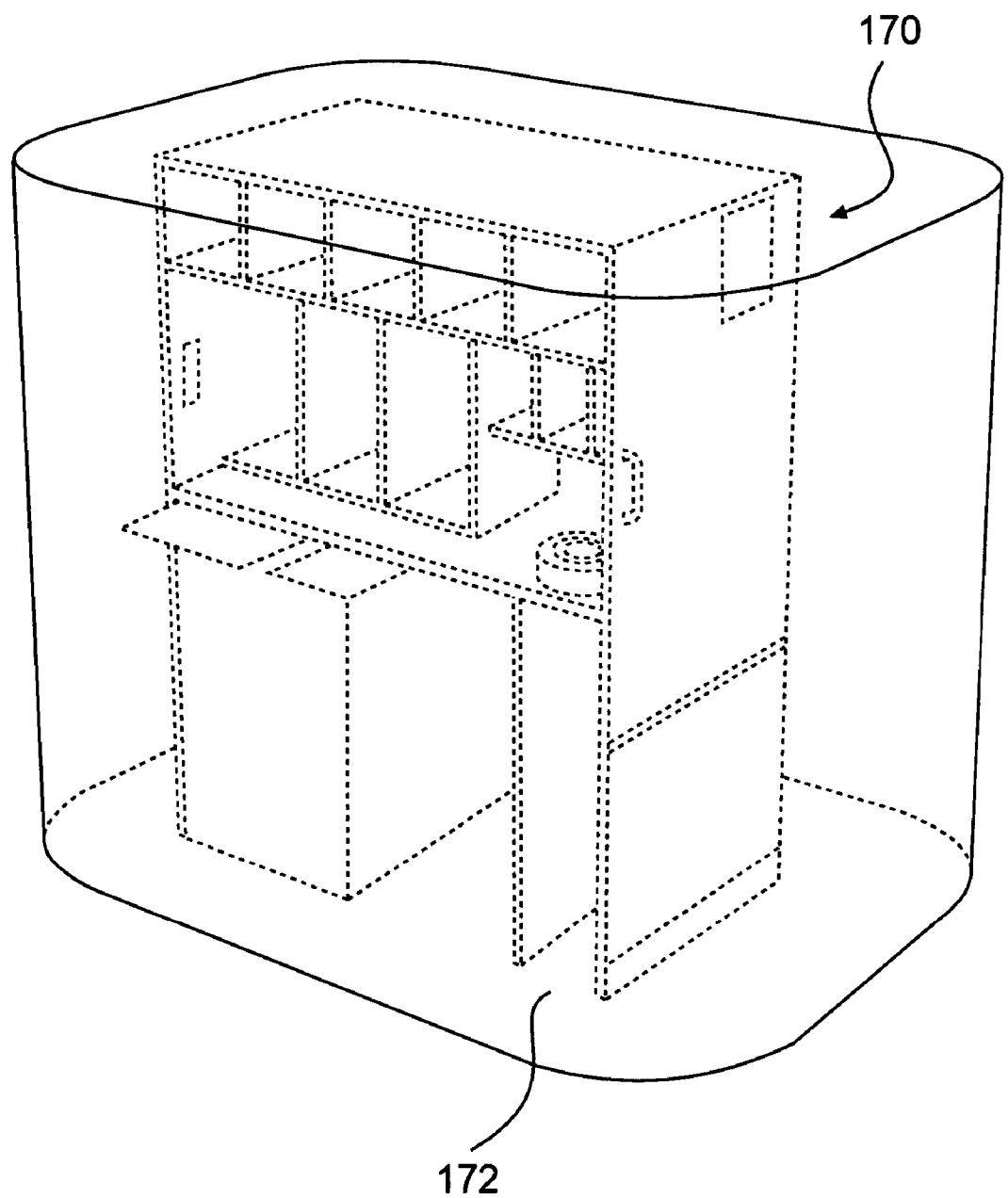
FIGS. 11 through 12 illustrates the galley geometries.
Figure 12:
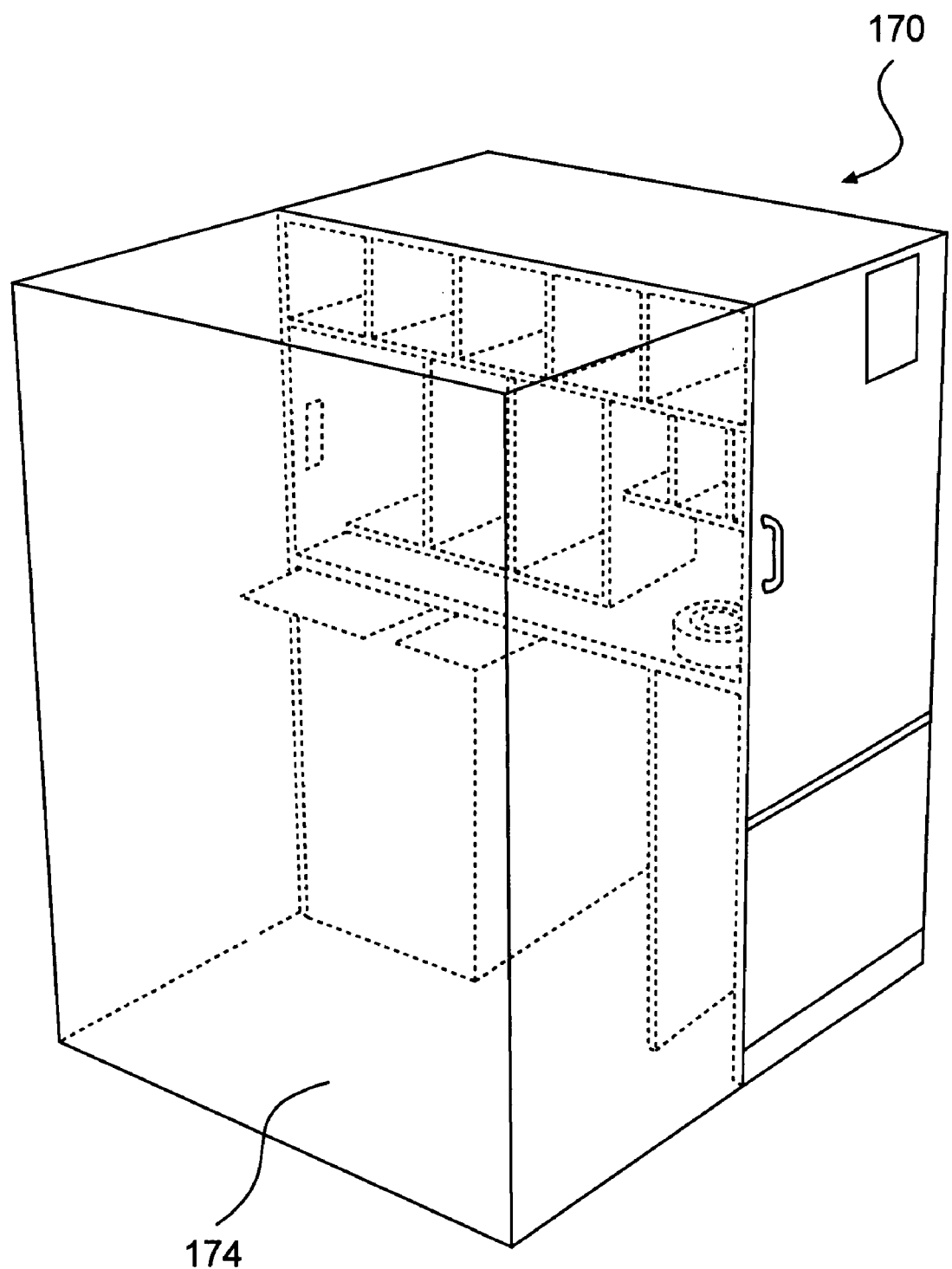
Figure 13:
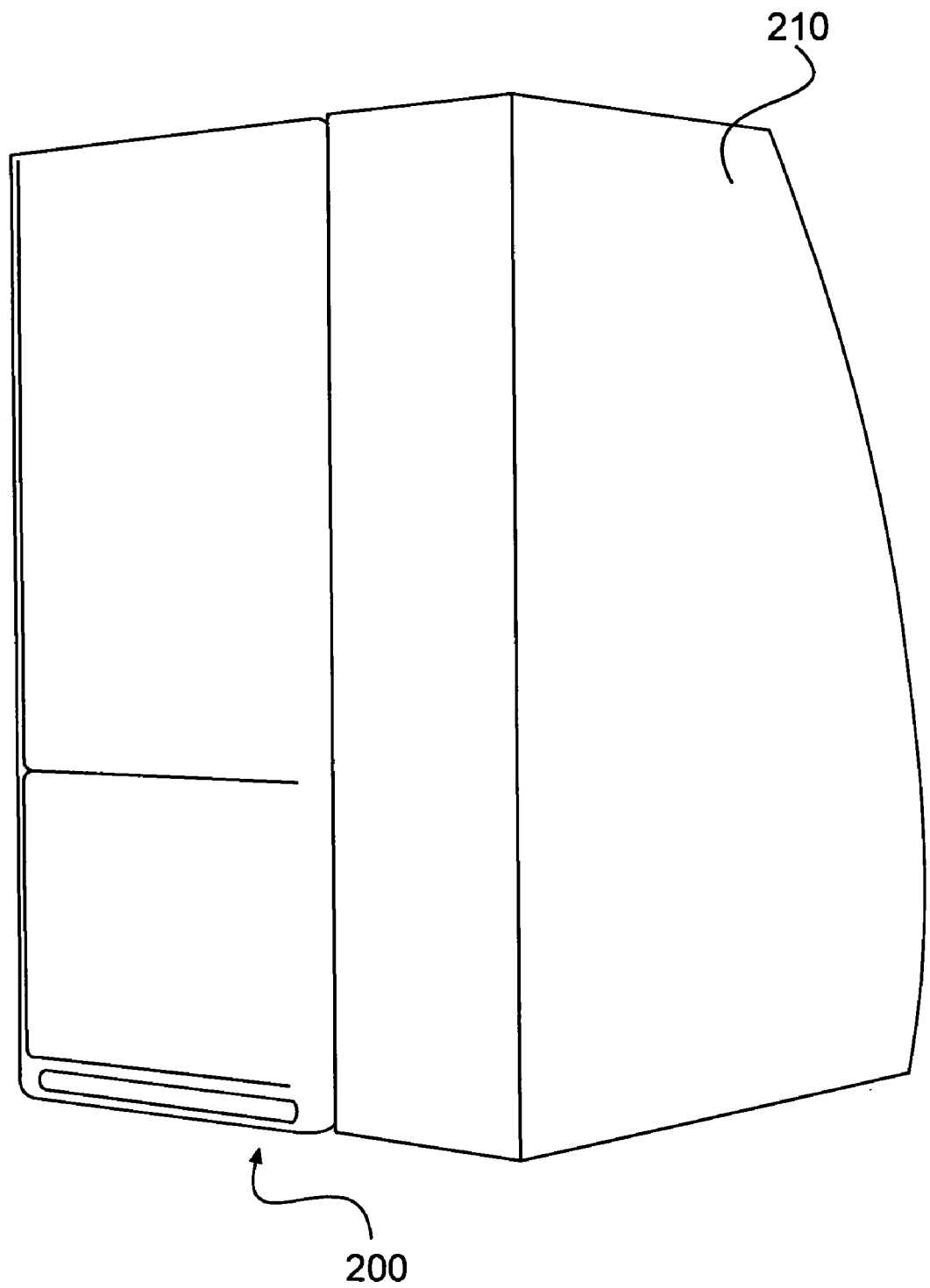
FIGS. 13 through 16 illustrates the lavatory geometries.
Figure 14:
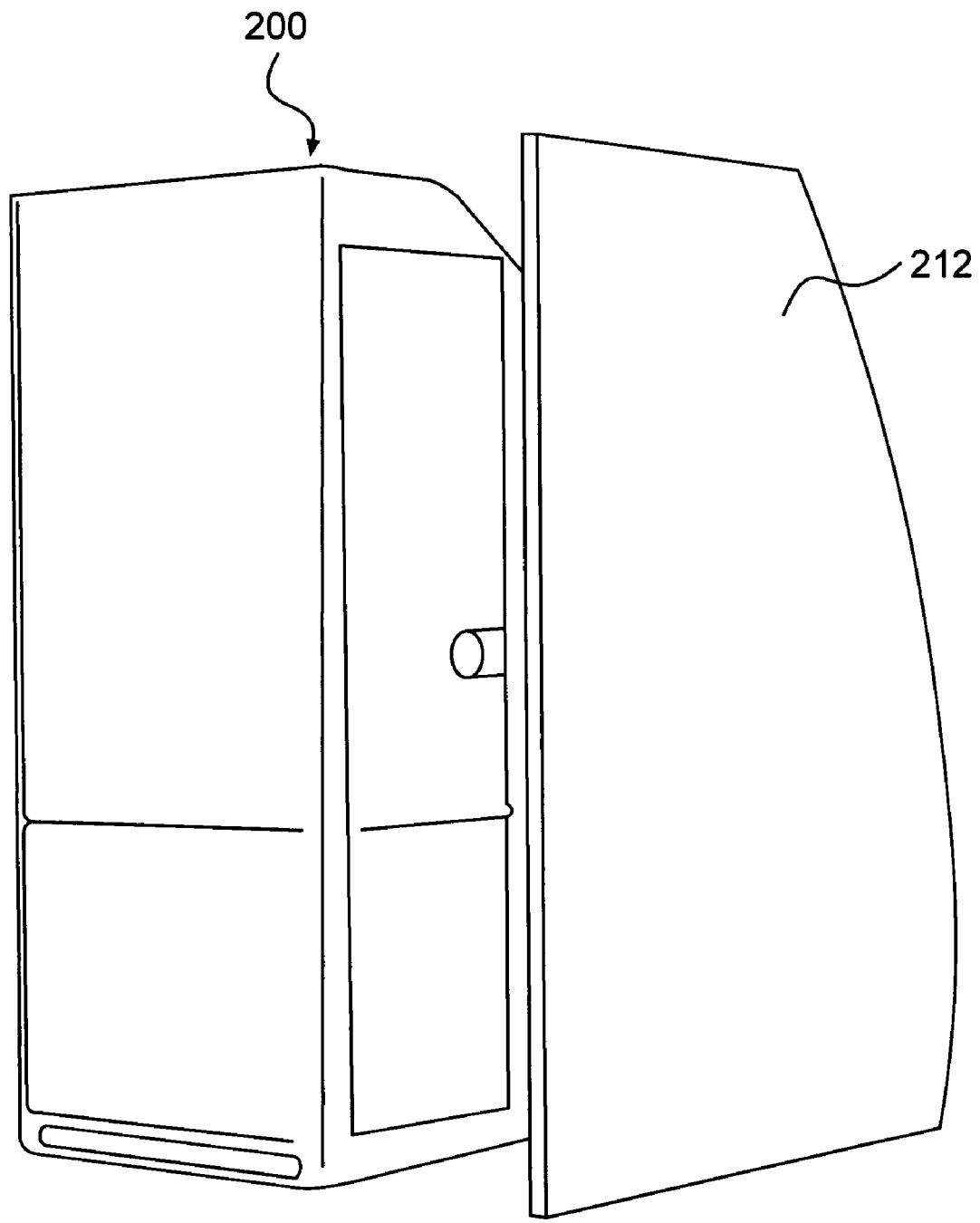
Figure 15:
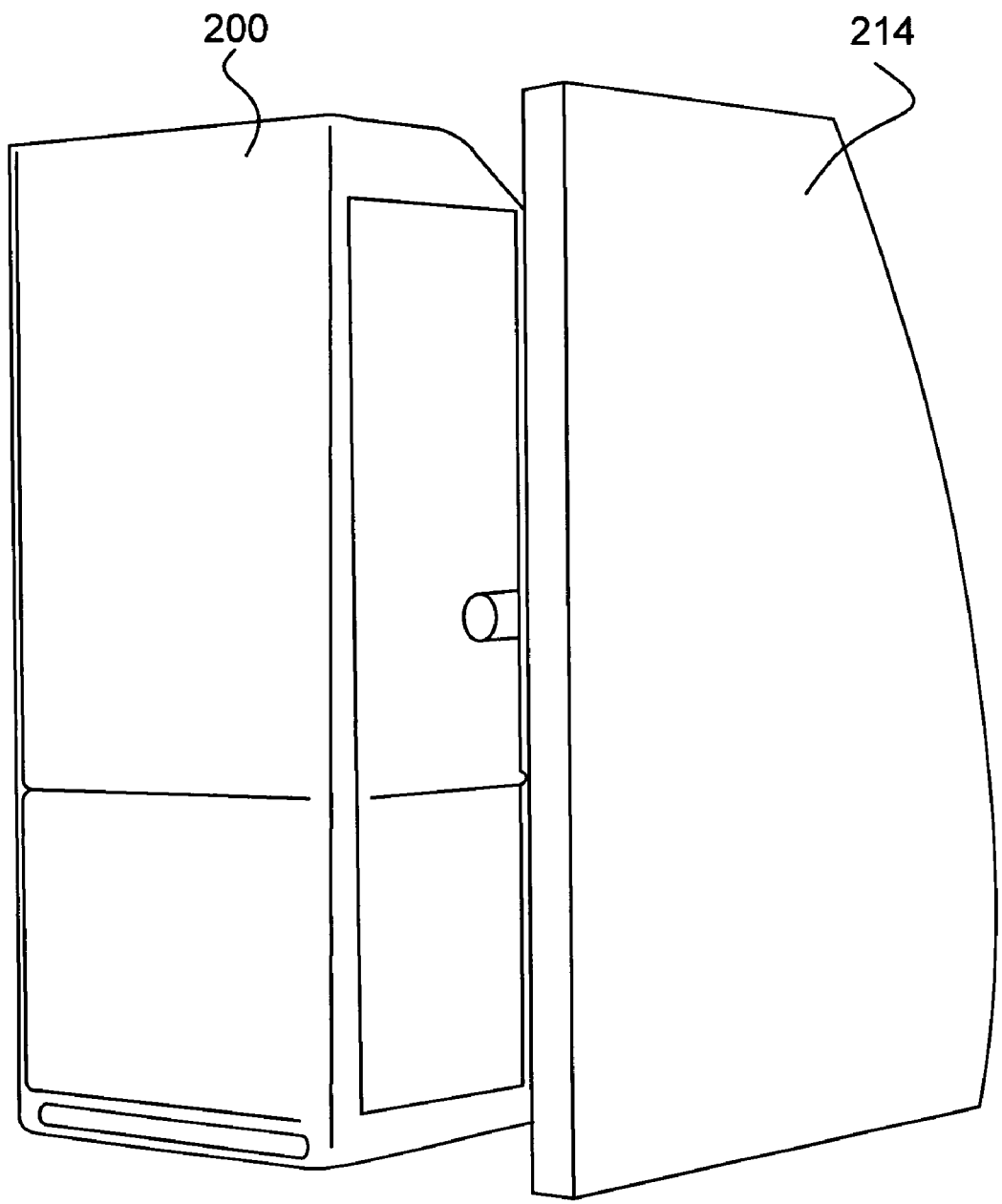
Figure 16:
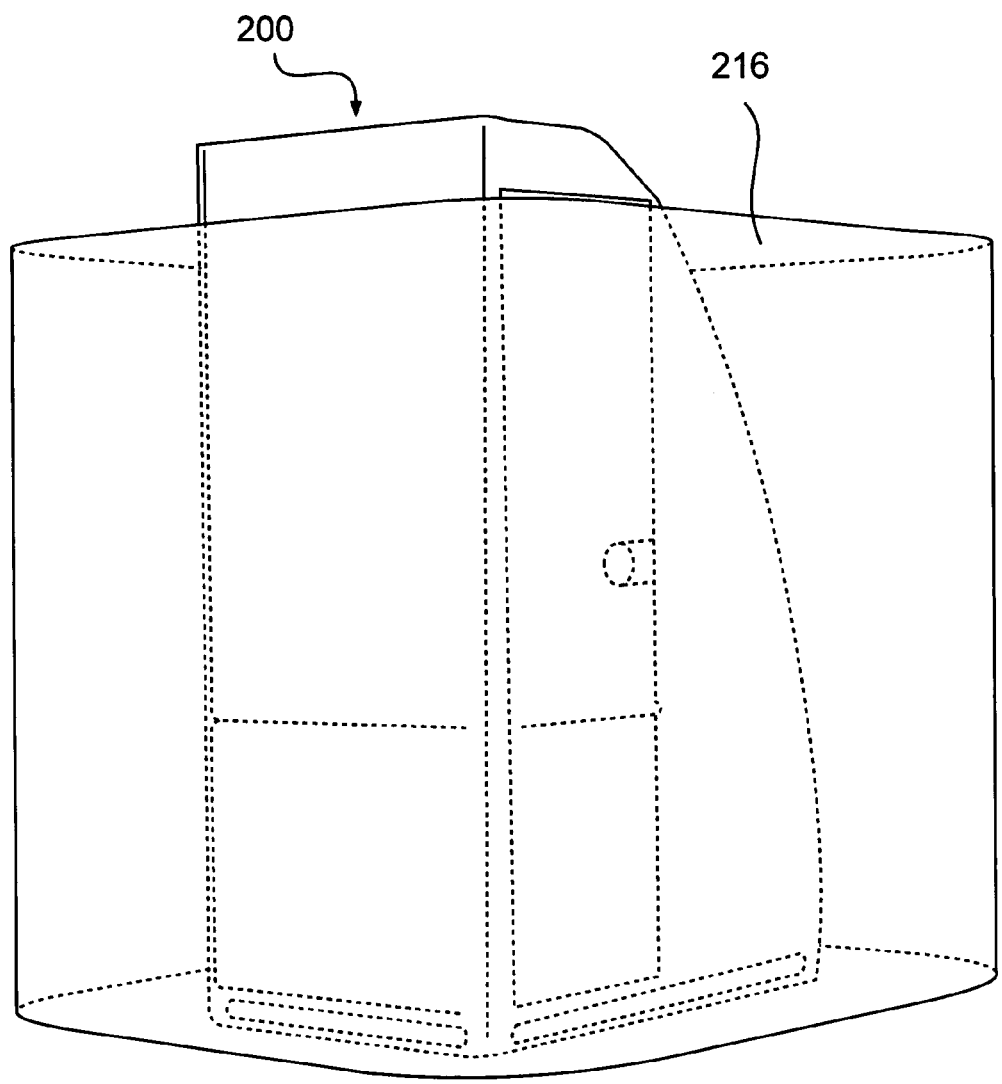

Referring to FIGS. 11 and 12, the galleys 170 are defined by a collection of physical and non-physical geometries. This example is showing only a few of these geometries. The galley 170 defines the physical monument. The galley workspace defines the non-physical area where the attendant stands to work in the galley. Galley lateral aisle 172 defines the non-physical area that provides the traveler an area to walk by the galley 170. Certain constraints can be taken into account with regard to the dimensions of the galley lateral aisle 172 so that a traveler can walk or certain objects can be transported through the galley lateral aisle including a cart or other objects, for example. The galley workspace 174 is another example of the non-physical geometries as seen in FIG. 12.

Referring to FIGS. 13 through 16, another example is lavatories 200, which are defined by a collection of physical and non-physical geometries. This example is showing only a few of these possible physical and non-physical geometries.

The lavatory 200 defines the physical monument as seen in FIGS. 13 through 16. Some or all of these geometries are used at a time depending on the placement of the lavatory in the airplane or other vehicle.

The access aisle 210, seat deflection 212 and hard surface extra aisle 214 are described in the pathway and cross aisle example above. The lateral aisle 216 is described in the lateral aisle 216 example above.

Figure 17:
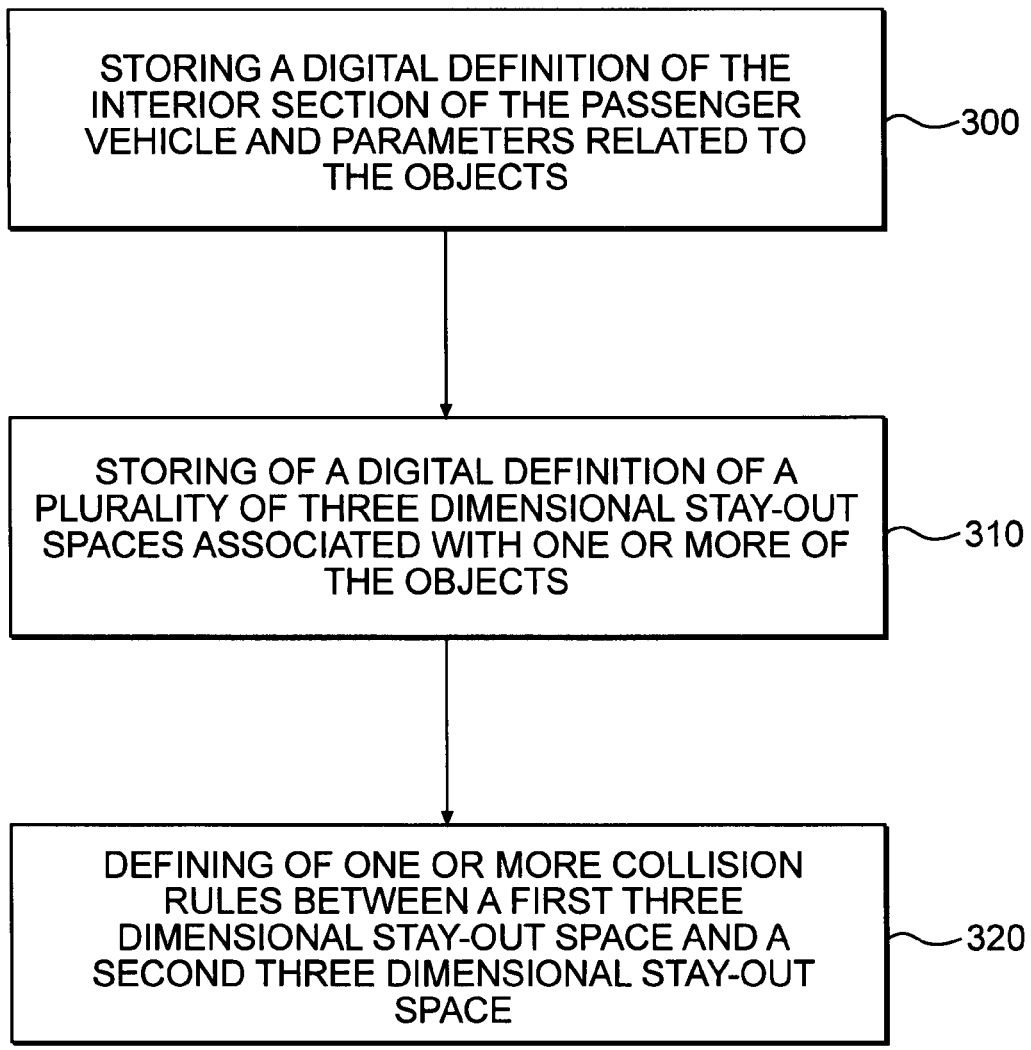
FIG. 17 is a flow chart of the technique used by the present invention.

Referring to FIG. 17, in the present invention, there is storing a digital definition of the interior section of the passenger vehicle and parameters related to the objects in a database 12 (Step 300). Then, there is a storing of a digital definition of a plurality of three dimensional stay-out spaces associated with one or more of the objects in the database 12 (step 310), for example. Then, after the storing of the digital definitions of steps 300 and 310, there is a defining of one or more collision rules between a first three dimensional stay-out space and a second three dimensional stay-out space (step 320). The rules define whether the first three dimensional stay-out space and the second three dimensional stay-out spaces may overlap. Furthermore, there is a designing of the interior section to accommodate objects based on the defined collision rules and object parameters. The database 12 can be in a database format or in an XML (extensible markup language) format. The database 12 is not limited to these types of formats, and can be in other formats.

The present invention has structure that produces the functionality with regard to the graphics, which are used in a computing application. The intelligence is defined in the graphics as well as the additional data, which is used within the computing application to aid in the placement of the object.

Previously in 3D modeling, a prototype solution is used with a tape measuring. However, in the present invention a unique prototype solution is made by there being created 3D graphics to be analyzed for collision.

Previously in a 2D solution, a computing tool in 2D made point to point measurements. In a 2D solution of the present invention, however, positioning of graphics are calculated based on separation rules and size of the object Previously, a fudge-factor was added to all placements to ensure that the regulatory agency/company requirements were met.

Any user that use 3D design to place objects with placement requirements can use the present invention. With the use of the present invention, there will be less resources, time, and cost in the LOPA definition.

Therefore, with the present invention, where will be more accurate work, so that less re-work is required. There will also be better ROI based on better use of space in the LOPA.

The present invention can be realized as computer-executable instructions in computer-readable media. The computer-readable media includes all possible kinds of media in which computer-readable data is stored or included or can include any type of data that can be read by a computer or a processing unit. The computer-readable media include for example and not limited to storing media, such as magnetic storing media (e.g., ROMs, floppy disks, hard disk, and the like), optical reading media (e.g., CD-ROMs (compact disc-read-only memory), DVDs (digital versatile discs), re-writable versions of the optical discs, and the like), hybrid magnetic optical disks, organic disks, system memory (read-only memory, random access memory), non-volatile memory such as flash memory or any other volatile or non-volatile memory, other semiconductor media, electronic media, electromagnetic media, infrared, and other communication media such as carrier waves (e.g., transmission via the Internet or another computer). Communication media generally embodies computer-readable instructions, data structures, program modules or other data in a modulated signal such as the carrier waves or other transportable mechanism including any information delivery media. Computer-readable media such as communication media may include wireless media such as radio frequency, infrared microwaves, and wired media such as a wired network. Also, the computer-readable media can store and execute computer-readable codes that are distributed in computers connected via a network. The computer readable medium also includes cooperating or interconnected computer readable media that are in the processing system or are distributed among multiple processing systems that may be local or remote to the processing system. The present invention can include the computer-readable medium having stored thereon a data structure including a plurality of fields containing data representing the techniques of the present invention.

An example of a computer, but not limited to this example of the computer, that can read computer readable media that includes computer-executable instructions of the present invention includes a processor that controls the computer. The processor uses the system memory and a computer readable memory device that includes certain computer readable recording media. A system bus connects the processor to a network interface, modem or other interface that accommodates a connection to another computer or network such as the Internet. The system bus may also include an input and output interface that accommodates connection to a variety of other devices.

Although an example of the system is shown using a particular set of zones, it will be appreciated that other zones can be used as appropriate to the type of vehicle being configured. Also, although the system is useful to configure the interior of passenger aircraft it can also be used to configure the interior of other passenger vehicles, including commuter or long-distance railcars, subway cars, and busses, and other configurable spaces such as auditoriums or stadiums.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A computer-implemented method for designing an interior section of an aircraft to accommodate objects for said interior section of said aircraft, comprising:

storing a digital definition of said objects as three dimensional volumes;

storing a digital definition of said interior section of said aircraft within which said objects are to be placed, said digital definition including parameters related to said objects;

storing a digital definition of a plurality of three dimensional stay-out spaces associated with one or more of said objects, at least one of said stay-out spaces comprising non-physical geometry associated with one of said objects, said non-physical geometry having intelligent data attached to said non-physical geometry, said intelligent data comprising requirements, at least one of said objects having at least two different non-physical geometries at least partially overlapping one another and having different intelligent data;

defining one or more collision rules between a first three dimensional stay-out space of one of said objects and a second three dimensional stay-out space of a different one of said objects, wherein said collision rules define whether said first three dimensional stay-out space and said second three dimensional stay-out space may overlap; and determining the three dimensional spatial placement of said objects relative to one another and relative to said interior section such that said objects are in compliance with said defined collision rules, said object parameters, and said intelligent data.

2. The method of claim 1, further comprising defining at least one collision rule between said three dimensional stay-out spaces and said interior section and parameters related to said objects.

3. The method of claim 1, wherein said digital definition of said interior section and said digital definition of said three dimensional stay-out spaces comprises a plurality of data objects representing different aspects of said interior.

4. The method of claim 2, wherein said digital definition of said interior section and said digital definition of said three dimensional stay-out spaces are displayed and manipulated visually, and designing said interior section being displayed.

5. The method of claim 1, wherein said stay-out spaces are defined according to a plurality of predefined constraints.

6. The method of claim 1, wherein said digital definition of said interior section includes physical constraints of said objects.

7. The method of claim 1, wherein said collision rules are between a plurality of digital definitions of said interior section and a plurality of digital definitions of said three dimensional stay-out spaces.

8. The method of claim 1, wherein said collision rules include between said digital definition of said interior section and parameters related to said objects and the digital definition of said plurality of three dimensional stay-out spaces associated with one or more of said objects.

9. The method of claim 1, wherein the requirements comprise at least one of regulatory requirements, company requirements, and manufacturer requirements.

10. A system for a computer-implemented method for designing an interior section of an aircraft to accommodate objects for said interior section of said aircraft, comprising:
a memory unit storing a digital definition of said objects as three dimensional volumes, and said memory unit storing a digital definition of said interior section of said aircraft within which said objects are to be placed, said digital definition including parameters related to said objects, said memory unit storing a digital definition of a plurality of three dimensional stay-out spaces associated with one or more of said objects, at least one of said stay-out spaces comprising non-physical geometry associated with one of said objects, said non-physical geometry having intelligent data attached to said non-physical geometry, said intelligent data comprising requirements, at least one of said objects having at least two different non-physical geometries at least partially overlapping one another and having different intelligent data; and
a processor connected to said memory unit, defining one or more collision rules between a first three dimensional stay-out space of one of said objects and a second three dimensional stay-out space of a different one of said objects, wherein said collision rules define whether said first three dimensional stay-out space and said second three dimensional stay-out space may overlap; and
said processor with said memory unit determining the three dimensional spatial placement of said objects relative to one another and relative to said interior section such that said objects are in compliance with said defined collision rules, said object parameters, and said intelligent data.

11. The system of claim 10, further comprising defining at least one collision rule between said three dimensional stay-out spaces and said interior section and parameters related to said objects.

12. The system of claim 10, wherein said digital definition of said interior section and said digital definition of said three dimensional stay-out spaces comprises a plurality of data objects representing different aspects of said interior.

13. The system of claim 10, wherein said digital definition of said interior section and said digital definition of said three dimensional stay-out spaces are displayed and manipulated visually, and designing said interior section being displayed.

14. The system of claim 10, wherein said stay-out spaces are defined according to a plurality of predefined constraints.

15. The system of claim 10, wherein said digital definition of said interior section includes physical constraints of said objects.

16. The system of claim 10, wherein said collision rules are between a plurality of digital definitions of said interior section and a plurality of digital definitions of said three dimensional stay-out spaces.

17. The system of claim 10, wherein said collision rules include between said digital definition of said interior section and parameters related to said objects and said digital definition of said plurality of three dimensional stay-out spaces associated with one or more of said objects.

18. The system of claim 10, wherein the requirements comprise at least one of regulatory requirements, company requirements, and manufacturer requirements.

19. A computer-implemented system for designing an interior section of an aircraft to accommodate objects for said interior section of said aircraft, comprising:
a means for storing a digital definition of said objects as three dimensional volumes;
a means for storing a digital definition of said interior section of said aircraft within which said objects are to be placed, said digital definition including parameters related to said objects;
a means for storing a digital definition of a plurality of three dimensional stay-out spaces associated with one or more of said objects, at least one of said stay-out spaces comprising non-physical geometry associated with one of said objects, said non-physical geometry having intelligent data attached to said non-physical geometry, said intelligent data comprising requirements, at least one of said objects having at least two different non-physical geometries at least partially overlapping one another and having different intelligent data;
a means for defining one or more collision rules between a first three dimensional stay-out space and a second three dimensional stay-out space, wherein said collision rules define whether said first three dimensional stay-out space and said second three dimensional stay-out space may overlap; and
a means for determining the three dimensional spatial placement of said objects relative to one another and relative to said interior section such that said objects are in compliance with said defined collision rules, said object parameters, and said intelligent data.

20. The system of claim 19, further comprising defining at least one collision rule between said three dimensional stay-out spaces and said interior section and parameters related to said objects.

21. The system of claim 19, wherein said digital definition of said interior section and said digital definition of said three dimensional stay-out spaces comprises a plurality of data objects representing different aspects of said interior.

22. The system of claim 19, wherein said digital definition of said interior section and said digital definition of said three dimensional stay-out spaces are displayed and manipulated visually, and designing said interior section being displayed.

23. The system of claim 19, wherein said stay-out spaces are defined according to a plurality of predefined constraints.

24. The system of claim 19, wherein said digital definition of said interior section includes physical constraints of said objects.

25. The system of claim 19, wherein said collision rules are between a plurality of digital definitions of said interior section and a plurality of digital definitions of said three dimensional stay-out spaces.

26. The system of claim 19, wherein said collision rules include between said digital definition of said interior section and parameters related to said objects and said digital definition of said plurality of three dimensional stay-out spaces associated with one or more of said objects.

27. The system of claim 19, wherein said digital definitions are stored in extensible markup language format.

28. The system of claim 19, wherein the requirements comprise at least one of regulatory requirements, company requirements, and manufacturer requirements.

* * * * *